(12) United States Patent
Joo et al.

(10) Patent No.: US 7,586,774 B2
(45) Date of Patent: Sep. 8, 2009

(54) STACKED FERROELECTRIC MEMORY DEVICES, METHODS OF MANUFACTURING THE SAME, FERROELECTRIC MEMORY CIRCUITS AND METHODS OF DRIVING THE SAME

(75) Inventors: Heung-Jin Joo, Gyeonggi-do (KR);
Byung-Gil Jeon, Gyeonggi-do (KR);
Byoung-Jae Bae, Gyeonggi-do (KR);
Ki-Nam Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 339 days.

(21) Appl. No.: 11/675,007

(22) Filed: Feb. 14, 2007

(65) Prior Publication Data

US 2007/0189056 A1 Aug. 16, 2007

(30) Foreign Application Priority Data

Feb. 15, 2006 (KR) ...................... 10-2006-0014639

(51) Int. Cl.
*G11C 11/22* (2006.01)
(52) U.S. Cl. ...................................... 365/145; 257/295
(58) Field of Classification Search ................. 365/145, 365/149; 257/295
See application file for complete search history.

(56) References Cited

U.S. PATENT DOCUMENTS 6,664,118 B2 * 12/2003 Nishihara et al. .............. 438/3
6,956,759 B2 * 10/2005 Nishihara .................... 365/145

FOREIGN PATENT DOCUMENTS

| JP | 8-330451 | 12/1996 |
|---|---|---|
| KR | 10-0219519 | 6/1999 |
| KR | 10-2001-0038789 | 5/2001 |

OTHER PUBLICATIONS

English language abstract of Japanese Publication No. 8-330451.
English language abstract of Korean Publication No. 10-0219519.
English language abstract of Korean Publication No. 10-2001-0038789.

* cited by examiner

*Primary Examiner*—Son Dinh
(74) *Attorney, Agent, or Firm*—Marger Johnson & McCollom, P.C.

(57) ABSTRACT

A stacked ferroelectric memory device has selection transistors including a first gate structure, a first impurity region, a second impurity region, a first insulating interlayer covering the selection transistors, bit line structures electrically connected to the first impurity regions, a second insulating interlayer covering the bit line structures, doped single crystalline silicon plugs formed through the first and the second insulating interlayers, each of which contacts the second impurity region and has a height greater than that of the bit line structures, active patterns disposed on the plugs and the second insulating interlayer, each of which contacts the plugs, and ferroelectric transistors disposed on the active patterns, each of which has a second gate structure including a ferroelectric layer pattern and a conductive pattern, a third impurity region and a fourth impurity region. The ferroelectric memory device performs a random access operation and has a high degree of integration.

23 Claims, 12 Drawing Sheets

STACKED FERROELECTRIC MEMORY DEVICES, METHODS OF MANUFACTURING THE SAME, FERROELECTRIC MEMORY CIRCUITS AND METHODS OF DRIVING THE SAME

CROSS-REFERENCE TO RELATED APPLICATIONS

This application claims priority under 35 USC § 119 to Korean Patent Application No. 2006-14639 filed on Feb. 15, 2006, the contents of which are herein incorporated by reference in their entirety for all purposes.

BACKGROUND

1. Technical Field

Example embodiments of the invention relate to stacked ferroelectric memory devices, methods of manufacturing the stacked ferroelectric memory devices, ferroelectric memory circuits and methods of driving the ferroelectric memory circuits. More particularly, example embodiments of the invention relate to stacked ferroelectric memory devices in which a random access operation is available and data is quickly readable without destroying data, methods of manufacturing the stacked ferroelectric memory devices, ferroelectric memory circuits in which a random access operation is available and data is quickly readable without destroying data, and methods of driving the ferroelectric memory circuits.

2. Description of the Related Art

Recently, various kinds of non-volatile memory devices have been studied as a next-generation memory device for replacing dynamic random access memory (DRAM) devices. The non-volatile memory devices have been studied with a goal of achieving a high storage capacity, a high response speed and a low power consumption architecture. Examples of the next-generation memory devices are magnetic random access memory (MRAM) devices, ferroelectric random access memory (FRAM) devices, phase-change random access memory (PRAM) devices, resistive random access memory (RRAM) devices, etc. The FRAM devices have an advantage that data in the FRAM devices is not volatile. Additionally, the FRAM devices have other advantages such as a high processing speed and a low power consumption architecture, which make the FRAM devices desirable for further research.

The FRAM devices have a ferroelectric transistor or a ferroelectric capacitor including a ferroelectric material serving as a memory, or storage, member in a unit cell. The ferroelectric material has hysteretic characteristics due to its spontaneous polarization. The unit cell of the FRAM devices may be implemented to have various structures such as a 1T1C structure consisting of one selection transistor and one capacitor or a 2T2C structure consisting of two selection transistors and two capacitors. Additionally, the unit cell of the FRAM devices may have a 1T structure consisting of one selection transistor.

When the FRAM devices have a unit cell of the 1T1C structure or the 2T2C structure, the FRAM devices perform a destructive readout (DRO) operation and a write-back operation after reading data, thereby slowing down the speed of reading data. Additionally, at least one transistor and one capacitor are needed in the unit cell so that an area occupied by the unit cell may be increased relative to other structures.

When the FRAM devices have a unit cell of the 1T structure, data may be determined by a fluctuation in the size of the drain current flowing in a channel region of the transistor that varies according to the polarization direction of a ferroelectric layer used as a gate insulation layer. The FRAM devices having the unit cell of the 1T structure may read data without destroying data, i.e., the FRAM devices perform a non-destructive readout (NDRO) operation so that reading data may be completed very quickly. Additionally, the degree of integration may be increased relative to other structures because only one ferroelectric transistor is needed in the unit cell. However, the FRAM devices having the unit cell of the 1T structure may have a significant disadvantage over other structures in that a read/write operation is performed by pages or blocks because a random access operation is not available in the above FRAM devices.

Therefore, there have been demands for non-volatile memory devices which are capable of performing a fast reading operation and a random access operation, i.e., an operation that selectively reads/writes data on a selected address, and also have a high degree of integration.

SUMMARY

Example embodiments of the invention provide stacked ferroelectric memory devices having a high degree of integration in which a non-destructive readout (NDRO) operation and a random access operation are available.

Other example embodiments of the invention provide methods of manufacturing the stacked ferroelectric memory devices having a high degree of integration in which an NDRO operation and a random access operation are available.

Still other example embodiments of the invention provide ferroelectric memory circuits in which an NDRO operation and a random access operation are available and at least two data may be stored in a unit cell.

Example embodiments of the invention also provide methods of driving the ferroelectric memory circuits in which an NDRO operation and a random access operation are available and at least two data may be stored in the unit cell.

BRIEF DESCRIPTION OF THE DRAWINGS

The above and other features and advantages of the invention will become more apparent by describing detailed example embodiments thereof with reference to the accompanying drawings, in which.

DETAILED DESCRIPTION

Figure 1:
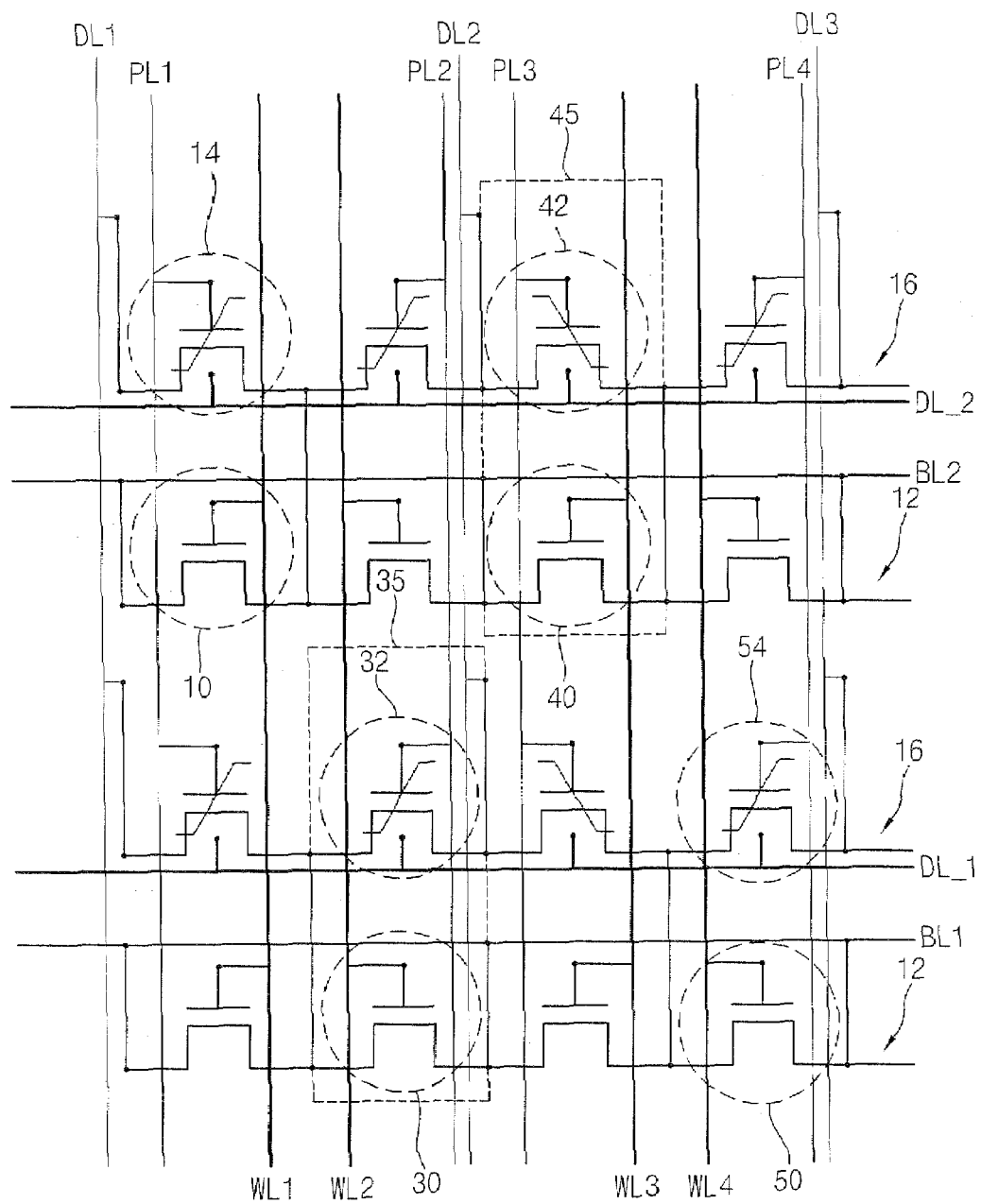
FIG. 1 is a circuit diagram illustrating a ferroelectric memory device in accordance with example embodiments of the invention.

The invention is described more fully hereinafter with reference to the accompanying drawings, in which example embodiments of the invention are shown. The invention may, however, be embodied in many different forms and should not be construed as limited to the example embodiments set forth herein. Rather, these example embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms arc intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-section illustrations that are schematic illustrations of idealized example embodiments (and intermediate structures) of the invention. As such, variations from the shapes of the illustrations as a result, for example, of manufacturing techniques and/or tolerances, are to be expected. Thus, example embodiments of the invention should not be construed as limited to the particular shapes of regions illustrated herein but are to include deviations in shapes that result, for example, from manufacturing tolerances. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments of the invention will be explained in detail with reference to the accompanying drawings.

FIG. 1 is a circuit diagram illustrating a ferroelectric memory device in accordance with example embodiments of the invention. As shown in FIG. 1, a cell array of the ferroelectric memory device includes eight unit cells. Each unit cell includes a selection transistor and a ferroelectric transistor. For example, each of the elements that are disposed at areas indicated as a reference numeral 35 and a reference numeral 45 functions as one of the unit cells, i.e., a first unit cell and a second unit cell, respectively.

Referring to FIG. 1, a first string 12 having selection transistors 10, 30, 40, and 50 that are connected in series with each other is prepared. Reference numerals 10, 30, 40 and 50 indicate some of the selection transistors, however, the rest of the eight selection transistors in FIG. 1 are not indicated with reference numerals in order to simplify the circuit diagram. Each of the selection transistors 10, 30, 40, and 50 includes a first gate structure, a first source region and a first drain region. Metal-oxide-semiconductor (MOS) transistors may be employed as the above-mentioned selection transistors. That is, the first gate structure included in each of the selection transistors 10, 30, 40 and 50 has a structure in which a gate insulation layer pattern and a conductive pattern are sequentially stacked on a substrate. In an example embodiment of the invention, a plurality of the first strings 12 is formed in the cell array of a semiconductor memory device, and two of the first strings 12 are shown in FIG. 1. Each of the first strings 12 may be disposed in parallel to one another.

The ferroelectric memory device includes a plurality of word lines WL1, WL2, WL3 and WL4, and each of the word lines WL1, WL2, WL3 and WL4 is electrically connected to some of the first gate structures. The word lines WL1, WL2, WL3 and WL4 are disposed in a first direction D1 substantially perpendicular to a second direction D2, i.e., an extension direction of the first strings 12. The gate structures of the selection transistors 10, 30, 40 and 50, which are electrically connected to the word lines WL1, WL2, WL3 and WL4, respectively, may be turned on or turned off by applying a voltage above a threshold voltage to the word lines WL1, WL2, WL3 and WL4.

The ferroelectric memory device includes bit lines BL1 and BL2, which are electrically connected to the first source regions and extend in the second direction D2. That is, the bit lines BL1 and BL2 extend to connect each of the first source regions of the selection transistors 10, 30, 40 and 50. Thus, one of the word lines WL1, WL2, WL3 and WL4 and one of the bit lines BL1 and BL2 are enabled so that one of the selection transistors 10, 30, 40 and 50, which is disposed at an interface between the enabled word line and the enabled bit line, may be turned on. Data may be selectively read from or written into one of ferroelectric transistors 14, 32, 42 and 54, which is electrically connected to the turned-on transistor, i.e. the selection transistor 10, 30, 40 or 50 that has been turned on by the enabled word line and bit line combination.

The ferroelectric memory device includes a second string 16 having a plurality of ferroelectric transistors each of which includes a second gate structure, a second source region and a second drain region. Reference numerals 14, 32, 42 and 54 indicate some of the ferroelectric transistors, however, the rest of the eight ferroelectric transistors in FIG. 1 are not indicated with reference numerals in order to simplify the circuit diagram. The second gate structure included in each of the ferroelectric transistors 14, 32, 42 and 54 has a structure in which a ferroelectric pattern and a conductive pattern are sequentially stacked on the substrate. In an example embodiment of the invention, a plurality of the second strings 16 is formed in the cell array of a semiconductor memory device, and two of the second strings 16 are shown in FIG. 1. Each of the second strings 16 may be disposed in parallel to one another. The ferroelectric pattern has characteristics that the polarization direction of the ferroelectric pattern changes according to an external voltage applied to the ferroelectric pattern.

In an example embodiment of the invention, the ferroelectric transistors 14, 32, 42 and 54 may be operable to store multi-level information.

Figure 2:
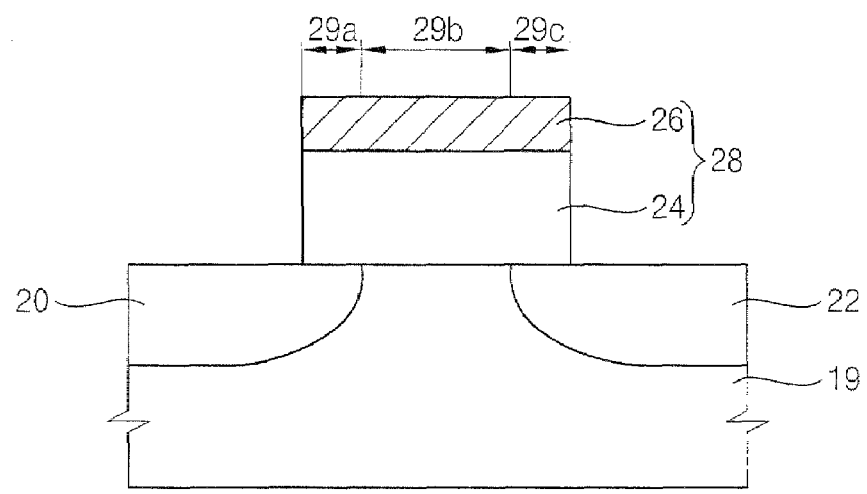
FIG. 2 is a cross-sectional view illustrating a ferroelectric transistor of FIG. 1, which may store multi-level information.

FIG. 2 is a cross-sectional view illustrating the ferroelectric transistor of FIG. 1, which may store multi-level information.

In an example embodiment of the invention, a second source region 20 and a second drain region 22 of the ferroelectric transistor 14 is formed to be overlapped by side portions of the second gate structure 28 as shown in FIG. 2. The second gate structure 28 has a structure in which a ferroelectric pattern 24 and an electrode 26 are sequentially stacked on a substrate 19. In an example embodiment of the invention, the substrate 19 is a bulk substrate and the electrode 26 has a plate shape. The second gate structure 28 may have three regions including a first region 29a, a second region 29b and a third region 29c. The second gate structure 28 may overlap the second source region 20 at the first region 29a. The second gate structure 28 may overlap a channel region, which is disposed between the second source region 20 and the second drain region 22 of the substrate 19, at the second region 29b. The second gate structure 28 may overlap the second drain region 22 at the third region 29c.

Referring again to FIG. 1, the first drain regions of the selection transistors 10, 30, 40 and 50 are electrically connected to the second source regions of the ferroelectric transistors 14, 32, 42 and 54, each of which corresponds to each of the selection transistors 10, 30, 40 and 50, respectively, so that data may be selectively read from or written into the ferroelectric transistors 14, 32, 42 and 54 using the selection transistors 10, 30, 40 and 50.

The ferroelectric memory device includes plate electrode lines PL1, PL2, PL3 and PL4 electrically connecting each of the second gate structures disposed in the first direction D1. A voltage difference between the second gate structure and the channel region or a voltage difference between the second gate structure and the second source or drain region may be controlled by applying a predetermined voltage to the plate electrode lines PL1, PL2, PL3 and PL4. Additionally, a polarization direction of the ferroelectric pattern may be changed by controlling the voltage differences.

The ferroelectric memory device includes first data lines DL1, DL2 and DL3 electrically connected to the second drain regions. Each of the first data lines DL1, DL2 and DL3 extends in the first direction D1.

Additionally, the ferroelectric memory device includes second data lines DL_1, DL_2 and DL_3 electrically connected to the channel regions. Each of the second data lines DL_1, DL_2 and DL_3 extends in the second direction D2.

Thus, data may be selectively read from or written into the ferroelectric transistor electrically connected to the turned-on selection transistor by driving one of the plate electrode lines PL1, PL2, PL3 and PL4, one of the first data lines DL1, DL2 and DL3, and one of the second data lines DL_1, DL_2 and DL_3, each of which is interlocked with the turned-on selection transistor.

Hereinafter, a method of performing read/write operations in the unit cells of the ferroelectric memory device shown in FIG. 1 is illustrated with reference to FIG. 1 and FIGS. 3 to 6. Specifically, when at least two data may be simultaneously recorded in one unit cell, a method of performing read/write operations for the at least two data recorded in one unit cell of the ferroelectric memory device will be illustrated.

First, a method of writing data into the unit cells of the ferroelectric memory device is illustrated. In the present example embodiment, data is written into the first unit cell 35 of the ferroelectric memory device in FIG. 1 for convenience of explanation.

Writing Data "1" and "1"

In an example embodiment of the invention, data "1" and "1" are written into the first unit cell 35 by inducing a negative charge into a channel region including a first portion of the channel region adjacent to the second source region and a third portion of the channel region adjacent to the second drain region.

The selection transistor 30 included in the first unit cell 35 is driven. Particularly, a high signal is applied to the word line WL2 electrically connected to the selection transistor 30, thereby turning on the first gate structures electrically connected to the word line WL2.

A low signal is applied to the bit line BL1 electrically connected to the selection transistor 30. When the low signal is applied to the bit line BL1, no voltage is applied to the second source region 20 of the ferroelectric transistor 32 through the first drain region of the selection transistor 30.

A low signal, which is a signal substantially the same as that applied to the bit line BL1, is applied to each of the first data line DL2 and the second data line DL_1 that are electrically connected to the ferroelectric transistor 32 included in the first unit cell 35.

A high signal, which is a signal substantially opposite to that applied to the bit line BL1, is applied to the second gate structure 28 through the plate line PL2.

Figure 3:
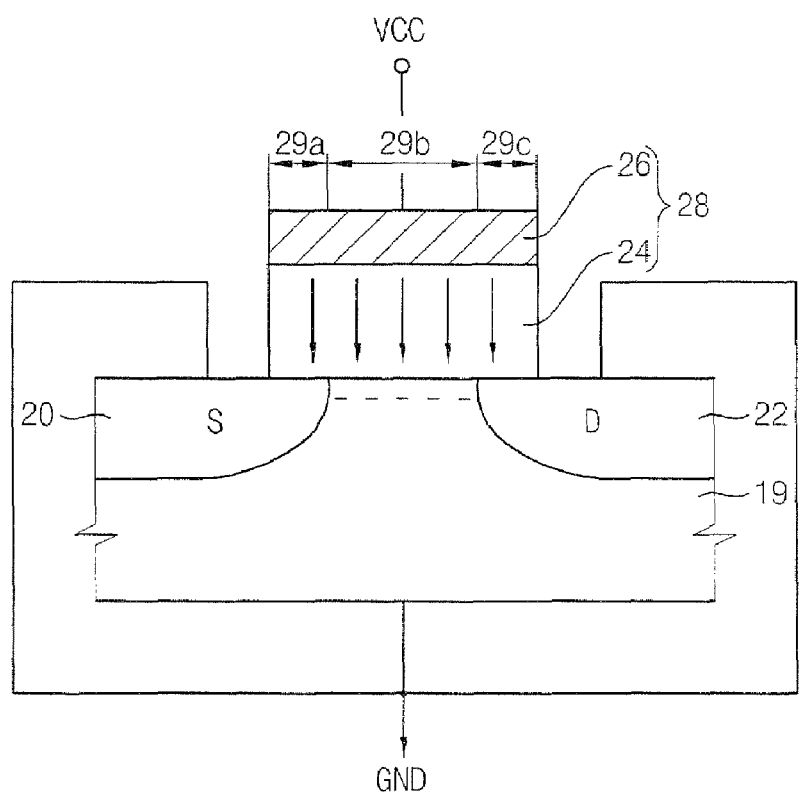
FIG. 3 shows polarization characteristics of a ferroelectric transistor when data "1" and "1" is written to the ferroelectric transistor.

FIG. 3 shows polarization characteristics of a ferroelectric transistor when data "1" and "1" is written to the ferroelectric transistor.

That is, when signals are applied to the ferroelectric transistor 32 as shown in FIG. 3, polarization occurs in the ferroelectric pattern 24 according to hysteretic characteristics of the ferroelectric pattern 24. Thus, the negative charge may be induced to the channel region and remain in the channel region.

Writing Data "0" and "0"

In an example embodiment of the invention, data "0" and "0" are written into the first unit cell 35 by inducing a positive charge into the channel region including the first portion of the channel region adjacent to the second source region and the third portion of the channel region adjacent to the second drain region.

The selection transistor 30 included in the first unit cell 35 is driven. Particularly, a high signal is applied to the word line WL2 electrically connected to the selection transistor 30, thereby turning on the first gate structures electrically connected to the word line WL2.

A high signal is applied to the bit line BL1 electrically connected to the selection transistor 30. When the high signal is applied to the bit line BL1, a voltage is applied to the second source region 20 of the ferroelectric transistor 32 through the first drain region of the selection transistor 30.

A high signal, which is a signal substantially the same as that applied to the bit line BL1, is applied to each of the first data line DL2 and the second data line DL_1 that are electrically connected to the ferroelectric transistor 32 included in the first unit cell 35.

A low signal, which is a signal substantially opposite to that applied to the bit line BL1, is applied to the second gate structure 28 through the plate line PL2.

Figure 4:
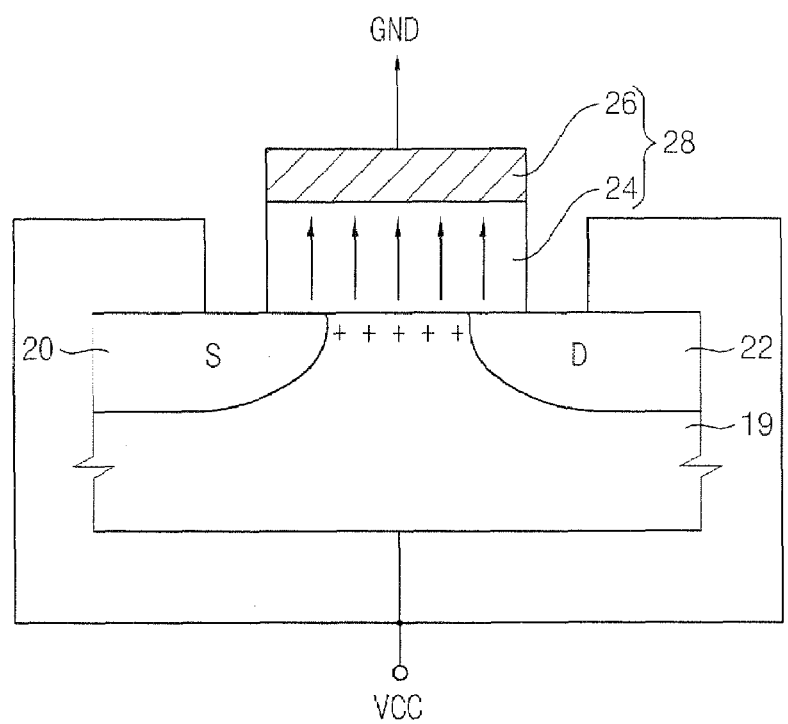
FIG. 4 shows polarization characteristics of a ferroelectric transistor when data "0" and "0" is written to the ferroelectric transistor.

FIG. 4 shows polarization characteristics of a ferroelectric transistor when data "0" and "0" is written to the ferroelectric transistor.

When signals are applied to the ferroelectric transistor 32 as shown in FIG. 4, polarization occurs in the ferroelectric pattern 24 according to hysteretic characteristics of the ferroelectric pattern 24. Thus, the positive charge may be induced to the channel region and remain in the channel region.

Writing Data "1" and "0"

In an example embodiment of the invention, data "1" and "0" are written into the first unit cell 35 by inducing a negative charge into the channel region including the third portion of the channel region adjacent to the second drain region and by inducing a positive charge into the first portion of the channel region adjacent to the second source region.

The selection transistor 30 included in the first unit cell 35 is driven. Particularly, a high signal is applied to the word line WL2 electrically connected to the selection transistor 30, and the first gate structures electrically connected to the word line WL2 are turned on.

A low signal is applied to the bit line BL1 electrically connected to the selection transistor 30. When the low signal is applied to the bit line BL1, no voltage is applied to the second source region 20 of the ferroelectric transistor 32 through the first drain region of the selection transistor 30.

A low signal, which is a signal substantially the same as that applied to the bit line BL1, is applied to each of the first data line DL2 and the second data line DL_1 that are electrically connected to the ferroelectric transistor 32 included in the first unit cell 35.

A high signal, which is a signal substantially opposite to that applied to the bit line BL1, is applied to the second gate structure 28 through the plate line PL2.

Polarization characteristics of the ferroelectric transistor 32 as shown in FIG. 3 may occur when the ferroelectric memory device is operated by the above processes.

A direction of the polarization in the first region 29a of the second gate structure 28 is then changed into a direction substantially opposite to the original direction.

Specifically, a high signal is applied to the bit line BL1. When the high signal is applied to the bit line BL1, a voltage is applied to the second source region 20 of the ferroelectric transistor 32 through the first drain region of the selection transistor 30. Additionally, a low signal, which is a signal substantially opposite to that applied to the bit line BL1, is applied to each of the second gate structure 28, the first data line DL2 and the second data line DL_1.

Figure 5:
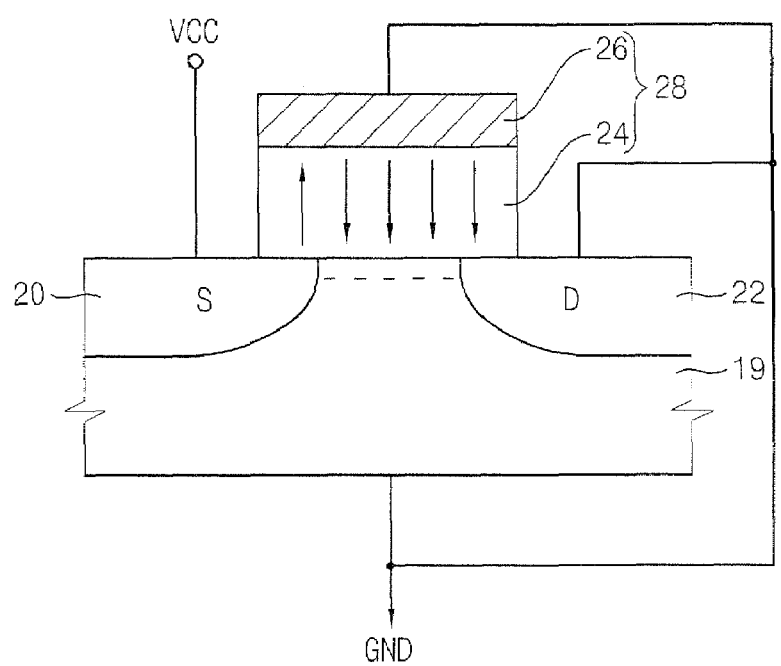
FIG. 5 shows polarization characteristics of a ferroelectric transistor when data "1" and "0" is written to the ferroelectric transistor.

FIG. 5 shows polarization characteristics of a ferroelectric transistor when data "1" and "0" is written to the ferroelectric transistor.

As shown in FIG. 5, directions of the polarization in the second and third regions 29b and 29c are not changed because voltages in the second and third regions 29b and 29c are not changed, whereas the direction of the polarization in the first region 29a of the second gate structure 28 is changed into the direction substantially opposite to the original direction.

Thus, a negative charge is induced into most portions of the channel region, while a positive charge may be induced into the first portion of the channel region adjacent to the second source region so that a depletion region may be generated in the first portion of the channel region.

Writing Data "0" and "1"

In an example embodiment of the invention, data "0" and "1" are written into the first unit cell 35 by inducing a positive charge into the channel region except for the first portion of the channel region adjacent to the second source region and the third portion of the channel region adjacent to the second drain region, and by inducing a negative charge into the first portion of the channel region and the third portion of the channel region.

The selection transistor 30 included in the first unit cell 35 is driven. Particularly, a high signal is applied to the word line WL2 electrically connected to the selection transistor 30, and the first gate structures electrically connected to the word line WL2 are turned on.

A high signal is applied to the bit line BL1 electrically connected to the selection transistor 30. When the high signal is applied to the bit line BL1, a voltage is applied to the second source region 20 of the ferroelectric transistor 32 through the first drain region of the selection transistor 30.

A high signal, which is a signal substantially the same as that applied to the bit line BL1, is applied to each of the first data line DL2 and the second data line DL_1 that are electrically connected to the ferroelectric transistor 32 in the first unit cell 35.

A low signal, which is a signal substantially opposite to that applied to the bit line BL1, is applied to the second gate structure 28 through the plate line PL2.

FIG. 4 illustrates polarization characteristics of the ferroelectric transistor 32 when the ferroelectric memory device is operated by the above processes.

Directions of the polarization in the first and third regions 29a and 29c of the second gate structure 28 are then changed into directions substantially opposite to the original directions.

Specifically, a low signal is applied to the bit line BL1. When the low signal is applied to the bit line BL1, no voltage is applied to the second source region 20 of the ferroelectric transistor 32 through the first drain region of the selection transistor 30. Additionally, a low signal, which is a signal substantially the same as that applied to the bit line BL1, is applied to the first data line DL2.

Furthermore, a high signal, which is a signal substantially opposite to that applied to the bit line BL1 and the first data line DL2, is applied to each of the second data line DL_1 and the second gate structure 28.

Figure 6:
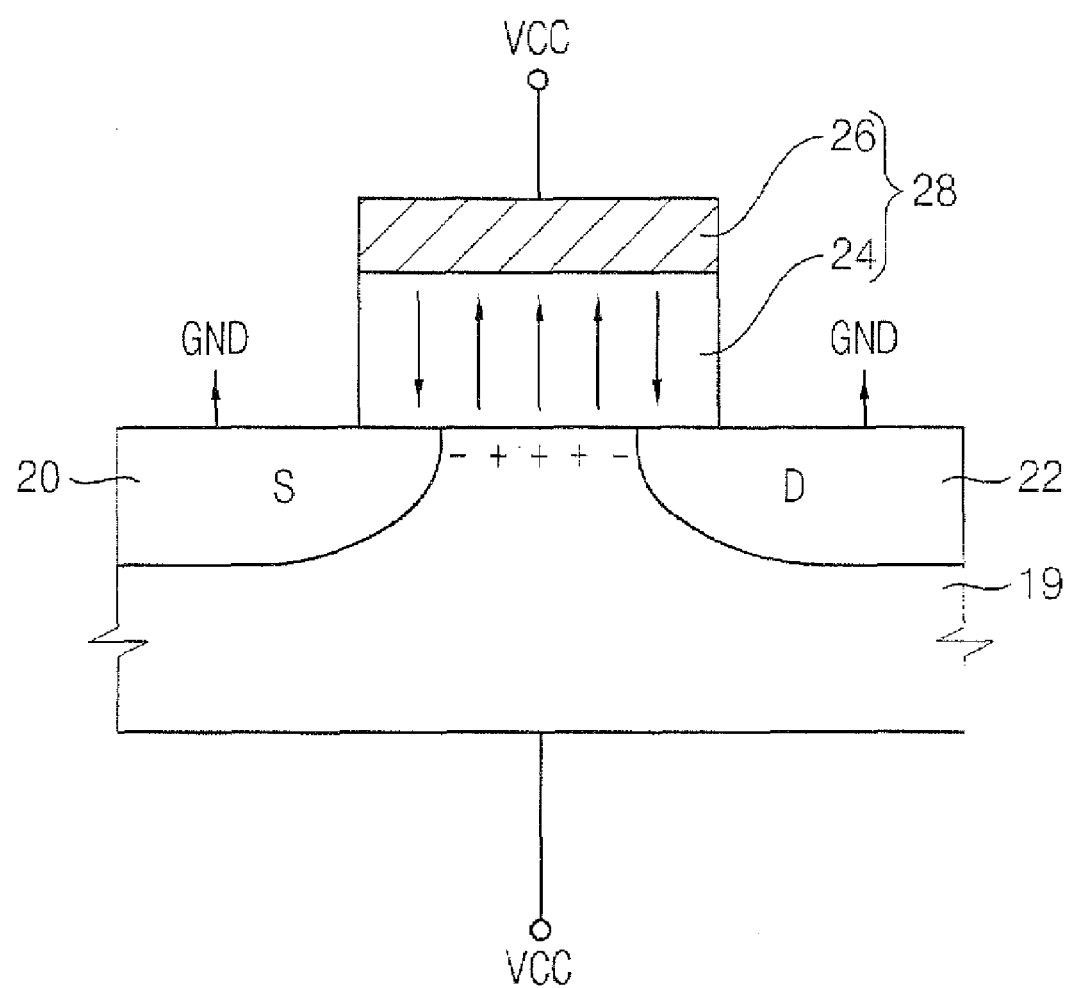
FIG. 6 shows polarization characteristics of a ferroelectric transistor when data "0" and "1" is written to the ferroelectric transistor.

FIG. 6 shows polarization characteristics of a ferroelectric transistor when data "0" and "1" is written to the ferroelectric transistor.

As shown in FIG. 6, directions of the polarization in the first and third regions 29a and 29c are changed into the directions substantially opposite to the original directions because voltages in the first and third regions 29a and 29c are changed, whereas the direction of the polarization in the second region 29b of the second gate structure 28 remains the same.

Thus, a positive charge is induced into a central portion of the channel region, whereas a negative charge may be induced into the first portion of the channel region adjacent to the second source region and the third portion of the channel region adjacent to the second drain region so that a depletion region may be generated in the central portion of the channel region.

As described above, a method of writing two data into one unit cell of the ferroelectric memory device has been illustrated, however, one data may be written into one unit cell of the ferroelectric memory device. When one data is written into one unit cell, the second source region 20 and the second drain region 22 of the ferroelectric transistor 32 do not need to be formed and overlapped by the side portions of the second gate structure 28 as shown in FIG. 2. Additionally, each of data "0" and data "1" may be written into the unit cell by a method substantially the same as or similar to the above method for writing data "0" and "0" or writing data "1" and "1."

Hereinafter, a method of reading data recorded in the unit cells of the ferroelectric memory device is illustrated. In the present example embodiment, data is read from the second unit cell 45 of the ferroelectric memory device in FIG. 1 for convenience of explanation.

A selection transistor 40 included in the second unit cell 45 is turned on. Particularly, a high signal is applied to each of the word line WL3 and the bit line BL2, which are electrically connected to the selection transistor 40, so that the second unit cell 45 may be selected. Thus, a reading voltage is applied to the second source region of the ferroelectric transistor 42 through the first drain region of the selection transistor 40.

A drain current in the ferroelectric transistor 42 is established. That is, a current flowing through the first data line DL2 electrically connected to the second drain region of the ferroelectric transistor 42 is established. No voltage is applied to the second gate structure 28 while reading data.

The drain current may be varied according to data recorded in the ferroelectric transistor 42.

For example, when data "1" and "1" are recorded in the unit cell, a negative charge is induced in the channel region so that a relatively large drain current may flow.

When data "1" and "0" are recorded in the unit cell, although a negative charge is induced in most of the channel region, a depletion region is formed in a first portion of the channel region adjacent to the second source region, and thus a drain current slightly smaller than a drain current flowing when data "1" and "0" are recorded may flow.

When data "0" and "1" are recorded in the unit cell, a depletion region is formed in a central portion of the channel region and a negative charge is induced in the first portion of the channel region and the third portion of the channel region adjacent to the second drain region, and thus a drain current slightly smaller than a drain current flowing when data "1" and "0" are recorded may flow.

When data "0" and "0" are recorded in the unit cell, a positive charge is induced in the channel region, and thus a drain current that is the smallest of the above-mentioned four cases may flow.

That is, the magnitude of the drain current Id that flows in the ferroelectric transistor varies according to data recorded in the unit cell as follows:

Id (1, 1 while reading data)>Id (1, 0 while reading data)>Id (0, 1 while reading data)>Id (0, 0 while reading data).

Data may be read from the unit cell by comparing the drain current that actually flows to a reference current.

Particularly, when the drain current is determined to be larger than a first reference current Iref1, data "1" and "1" may be read. When the drain current is determined to be smaller than the first reference current Iref1 but larger than a second reference current Iref2, data "1" and "0" are read. When the drain current is determined to be smaller than the second reference current Iref2 but larger than a third reference current Iref3, data "0" and "1" are read. When the drain current is determined to be smaller than the third reference current Iref3, data "0" and "0" are read.

A pulse signal larger than a breakdown voltage is not applied between the second gate structure 28 and the second source region 20, between the second gate structure 28 and the second drain region 22, or between the second gate structure 28 and the substrate 19 because a voltage is not applied to the second gate structure 28 of the ferroelectric transistor 42 while reading data. Thus, data stored in the unit cell may remain even after the data is read. As a result, the ferroelectric memory device may have characteristics such as non-volatility and non-destructive readout (NDRO).

Additionally, after a unit cell is selected by driving the bit line BL2 and the word line WL3, a desired data may be written into or read from the selected unit cell.

Figure 7:
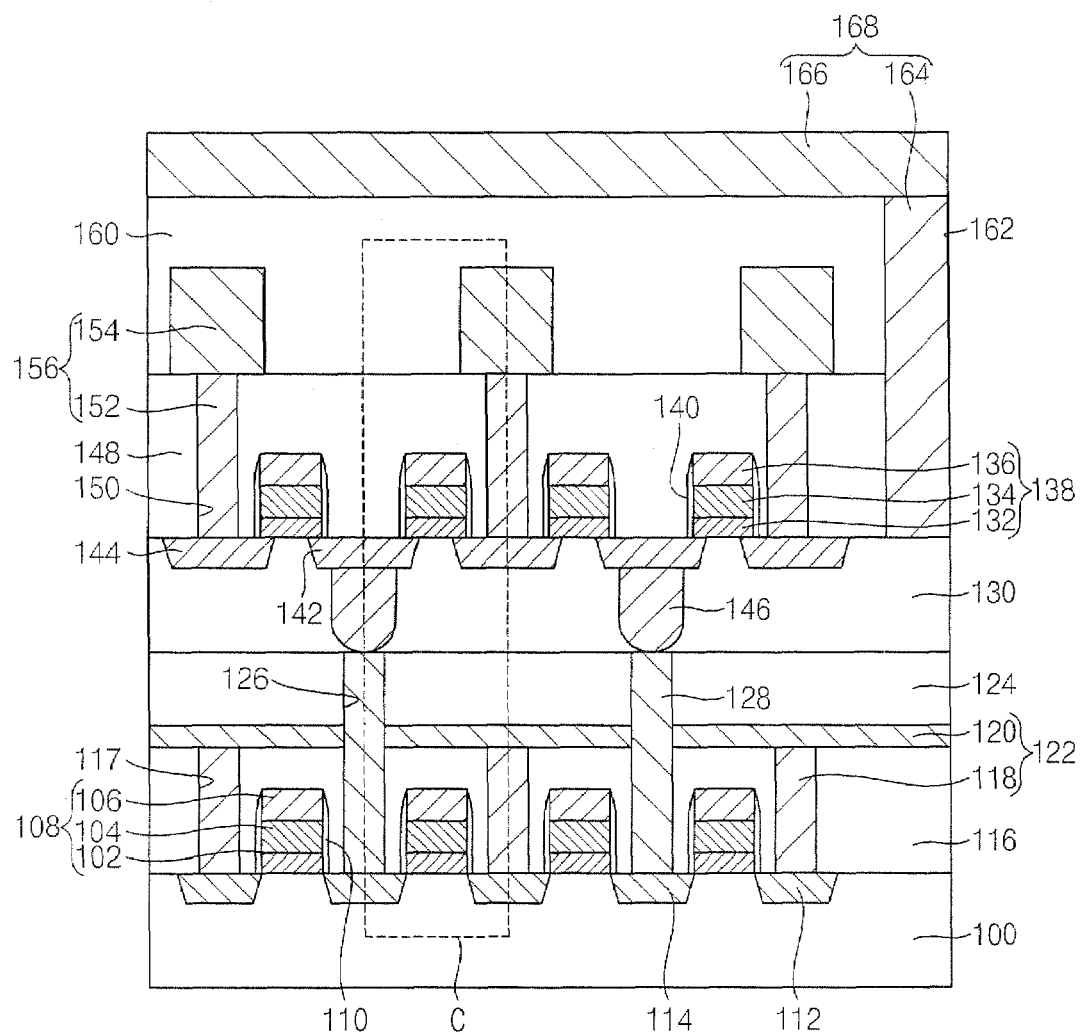
FIG. 7 is a cross-sectional view illustrating a ferroelectric memory device in accordance with example embodiments of the invention.
Figure 8:
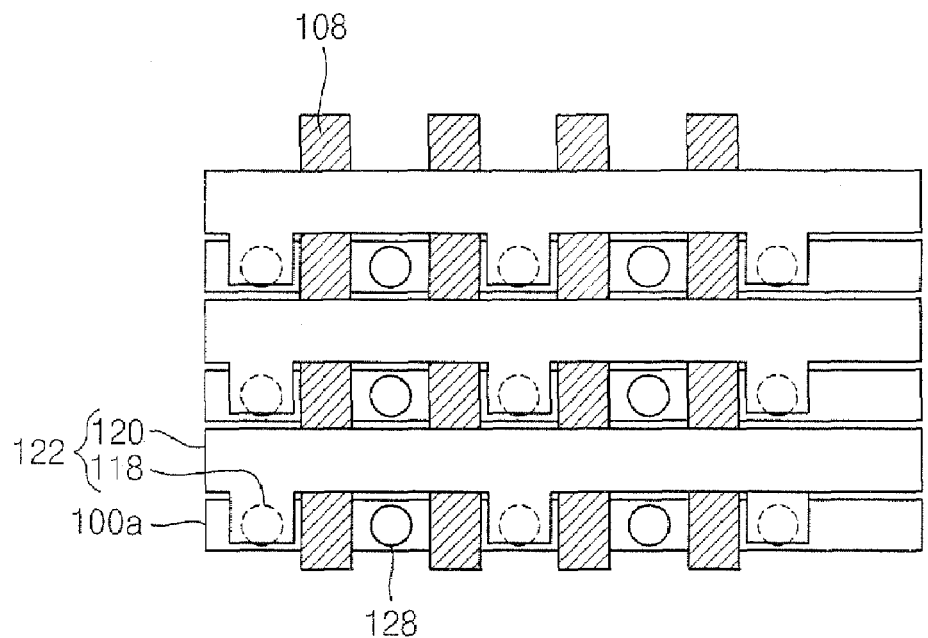
FIG. 8 is a top plan view of a structure including elements formed under the active pattern in FIG. 7.
Figure 9:
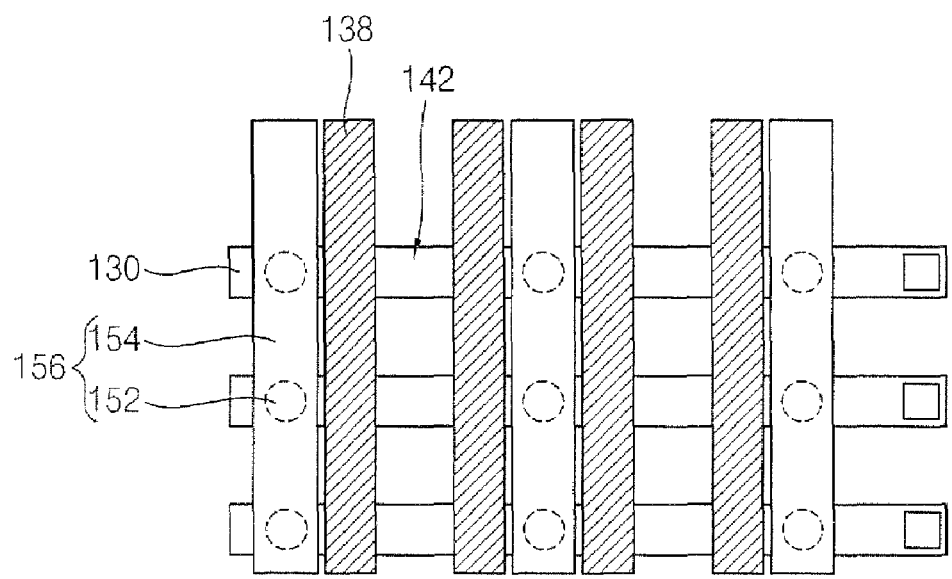
FIG. 9 is a top plan view of a structure including elements formed under the first data line over the active pattern in FIG. 7.

FIG. 7 is a cross-sectional view illustrating a ferroelectric memory device in accordance with example embodiments of the invention, FIG. 8 is a top plan view of a structure including elements formed under the active pattern in FIG. 7, and FIG. 9 is a top plan view of a structure including elements formed under the first data line over the active pattern.

An area "C" in FIG. 7 may serve as a unit cell in the ferroelectric memory device.

Referring to FIGS. 7 and 8, an active region 100a and an isolation region (not shown) are formed in a substrate 100. The active region 100a may have a linear shape extending in a first direction.

A plurality of selection transistors each of which includes a first gate structure 108, a first impurity region 112 and a second impurity region 114 is formed on the substrate 100. The first gate structure 108 has a gate insulation layer 102, a first gate electrode 104 and a first hard mask 106 that are sequentially stacked on the substrate 100. A first spacer 110 may be formed on a sidewall of the first gate structure 108. The first spacer 110 may include silicon nitride.

Each of the first and second impurity regions 112 and 114 is formed at an upper portion of the substrate 100 adjacent to the first gate structure 108, and may serve as a source region or a drain region. The first gate electrode 104 included in the first gate structure 108 may have a linear shape extending in a second direction substantially perpendicular to the first direction. Thus, a plurality of the first gate electrodes 104 may serve as a word line.

Each of the first and second impurity regions 112 and 114 may serve as a common source region or a common drain region of two adjacent selection transistors. The selection transistors may be connected in series.

A first insulating interlayer 116 is formed on the substrate 100 to cover the selection transistors. A plurality of first openings 117 is formed through the first insulating interlayer to partially expose the first impurity region 112.

A plurality of bit line structures 122 is formed on or over the substrate 100 to be electrically connected to the first impurity region 112. Particularly, each of the bit line structures 122 includes a bit line pad 118 and a bit line 120. The bit line pad 118 is formed on the substrate 100 to fill up one of the first openings 117. The bit line pad 118 may include a conductive material. The bit line 120 is formed on the first insulating interlayer 116 to be connected to the bit line pad 118. The bit line 120 may have a linear shape extending in the first direction.

A second insulating interlayer 124 is formed on the first insulating interlayer 116 to cover the bit line structures 122. A plurality of second openings 126 is formed through the first and second insulating interlayers 116 and 124 to partially expose the second impurity region 114.

A plurality of plugs 128 is formed on the substrate 100 to fill up the second openings 126. The plugs 128 may include single crystalline silicon. Each of the plugs 128 is formed through the first and second insulating interlayers 116 and 124 and has a height greater than those of the bit line structures 122. The plugs 128 may be formed by a selective epitaxial growth (SEG) process using the substrate 100 as a seed. The plugs 128 are doped with impurities having substantially the same type as those doped in the second impurity region 114, and thus the plugs 128 are electrically connected to the second impurity region 114.

As shown in FIG. 7, one second impurity region 114 may serve as a common drain region of two adjacent selection transistors, and thus one of the plugs 128 electrically connected to the second impurity region 114 may transfer signals from the two adjacent selection transistors to other elements.

Hereinafter, elements formed on or over the plugs 128 are illustrated.

Referring to FIGS. 7 and 9, a plurality of active patterns 130 is formed on the second insulating interlayer 124 to make contact with the plugs 128. The active patterns 130 may include single crystalline silicon. Each of the active patterns 130 may serve as an active region for forming a ferroelectric transistor. In an example embodiment of the invention, the ferroelectric transistor is formed to be opposite to the selection transistor. Each of the active patterns 130 may have a linear shape extending in the first direction.

A plurality of the ferroelectric transistors is formed on the active patterns 130.

Each of the ferroelectric transistors has a second gate structure 138 including a ferroelectric layer pattern 132, a second gate electrode 134 and a second hard mask 136 that are sequentially stacked on the active patterns 130, a third impurity region 142 and a fourth impurity region 144.

The second gate structure 138 may have a structure such as a metal-ferroelectric-silicon (MFS) structure, a metal-ferroelectric-metal-silicon (MFMS) structure, a metal-ferroelectric-metal-insulator-semiconductor (MFMIS) structure, etc.

A second spacer 140 may be further formed on a sidewall of the second gate structure 138. The second spacer 140 may include silicon nitride.

Alternatively, the second spacer 140 may include a stacked structure in which an aluminum oxide layer and a silicon nitride layer are sequentially stacked, thereby preventing degradation of the ferroelectric layer pattern 132.

The second gate electrode 134 may have a linear shape extending in the second direction substantially perpendicular to the first direction. Thus, the second gate electrode 134 may serve not only as a gate electrode of the ferroelectric transistor but also as a gate electrode line connecting a plurality of the gate electrodes to one another.

The ferroelectric layer pattern 132 may include a material in which polarization may occur according to an external voltage. For example, the ferroelectric layer pattern 132 may include PZT [$Pb(Zr, Ti)O_3$], SBT [$Sr(Bi, Ti)O_3$], BLT [$Bi(La, Ti)O_3$], PLZT [$Pb(La, Zr)TiO_3$], BST[$Bi(Sr, Ti)O_3$], etc. When the ferroelectric layer pattern 132 includes PZT, zirconium and titanium may be included at a ratio by weight of about 25:75 to about 40:60. Additionally, the ferroelectric layer pattern 132 may include PZT, SBT, BLT, PLZT, BST, etc., doped with potassium, lanthanum, manganese, bismuth, etc.

Each of the third and fourth impurity regions 142 and 144 may serve as a source region or a drain region of the ferroelectric transistor, and is formed at an upper portion of each of the active patterns 130 adjacent to the second gate structure 138.

In an example embodiment of the invention, each of the third and fourth impurity regions 142 and 144 may serve as a common source region or a common drain region of two adjacent ferroelectric transistors. The ferroelectric transistors may be connected in series.

The third and fourth impurity regions 142 and 144 are doped with impurities having substantially the same type as those doped in the first and second impurity regions 112 and 114.

In some example embodiments of the present invention, the third and fourth impurity regions 142 and 144 are formed to be overlapped by side portions of the second gate structure 138 so that at least two data may be simultaneously written into or read from one ferroelectric transistor. Hereinafter, a first portion of the ferroelectric layer pattern 132 overlapping the third impurity region 142 is referred to as a first region, a second portion of the ferroelectric layer pattern 132 overlapping a channel region is referred to as a second region, and a third portion of the ferroelectric layer pattern 132 overlapping the fourth impurity region 144 is referred to as a third region.

A fifth impurity region 146 is formed in each of the active patterns 130 to electrically connect the third impurity region 142 to each of the plugs 128. The fifth impurity region 146 is doped with impurities having substantially the same type as those doped in the second impurity region 114. Thus, the third impurity region 142 may be electrically connected to the second impurity region 114 through each of the plugs 128 and the fifth impurity region 146.

A third insulating interlayer 148 is formed on the active patterns 130 to cover the ferroelectric transistors. A plurality of third openings 150 is formed through the third insulating interlayer 148 to partially expose the fourth impurity region 144.

A plurality of first data line structures 156 is formed on or over the active patterns 130 to be electrically connected to the fourth impurity region 144. Particularly, each of the first data line structures 156 includes a first data line pad 152 and a first data line 154. The first data line pad 152 is formed on the active patterns 130 to fill up the third openings 150. The first data line pad 152 may include a conductive material. The first data line 154 is formed on the third insulating interlayer 148 to make contact with the first data line pad 152.

A fourth insulating interlayer 160 is formed on the third insulating interlayer 148 to cover the first data line structures 156. A second data line structure 168 is formed on or over the active patterns 130. In an example embodiment of the present invention, the second data line structure 168 is connected to end portions of the active patterns 130.

Particularly, a fourth opening 162 is formed through the third and fourth insulating interlayers 148 and 160 to partially expose the active patterns 130. In an example embodiment of the present invention, two fourth openings 162 are formed to expose the end portions of the active patterns 130. The second data line structure 168 includes a second data line pad 164 and a second data line 166. The second data line pad 164 is formed on the active patterns 130 to fill up the fourth opening 162. In an example embodiment of the present invention, two second data line pads 164 are formed to fill up the two fourth openings 162 exposing the end portions of the active patterns 130.

In the ferroelectric memory device in accordance with some example embodiments of the present invention, the selection transistors and the ferroelectric transistors are vertically stacked so that a horizontal area for implementing a unit cell may be reduced. Particularly, the unit cell may have a size as small as $4F^2$ (Here, "F" means a critical dimension.)

Additionally, one selection transistor and one ferroelectric transistor are included in one unit cell so that the ferroelectric memory device may perform a random access operation and have NDRO characteristics.

FIGS. 10 to 18 are cross-sectional views illustrating a method of manufacturing the ferroelectric memory device of FIG. 7 in accordance with some example embodiments of the present invention.

Figure 10:
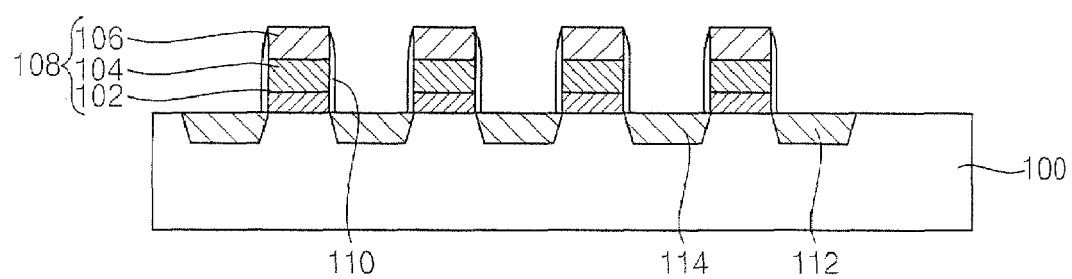
FIGS. 10 to 18 are cross-sectional views illustrating a method of manufacturing the ferroelectric memory device of FIG. 7 in accordance with some example embodiments of the invention.

Referring to FIG. 10, a substrate 100 is prepared. The substrate 100 may include single crystalline silicon. An upper portion of the substrate 100 is removed by an etching process to form a trench (not shown). The trench may be formed to have a linear shape extending in a first direction. An insulating material is filled into the trench to form an isolation layer. Thus, an active region and a field region each of which extends in the first direction are formed in the substrate 100.

A gate insulation layer is formed on the substrate 100. The gate insulation layer may be formed by a thermal oxidation process or a chemical vapor deposition (CVD) process.

A first conductive layer and a first hard mask layer are sequentially formed on the gate insulation layer. The first conductive layer may be formed using a doped polysilicon.

A first photoresist pattern (not shown) extending in a second direction substantially perpendicular to the first direction is formed on the first hard mask layer. The first hard mask layer is partially removed by an etching process using the first photoresist pattern as an etching mask to form a first hard mask 106. The first hard mask 106 may have a linear shape extending in the second direction.

The first conductive layer and the gate insulation layer are partially removed by an etching process using the first hard mask 106 as an etching mask to form a first gate electrode 104 and a gate insulation layer pattern 102, respectively. Thus, a first gate structure 108 including the gate insulation layer pattern 102, the first gate electrode 104 and the first hard mask 106 that are sequentially stacked on the substrate 100 is formed. In an example embodiment of the invention, a plurality of the first gate structures 108 is formed on the substrate 100.

A first spacer layer is formed on the substrate 100 to cover the first gate structures 108. The first spacer layer may be formed using silicon nitride. The first spacer layer may be partially removed by an etch-back process, a chemical mechanical polishing (CMP) process, or a combination process of etch-back and CMP to form a first spacer 110 on sidewalls of the first gate structures 108.

Impurities are implanted onto a top surface of the substrate 100, which is not covered by the first gate structures 108. Thus, a first impurity region 112 and a second impurity region 114 are formed at a top surface of the substrate 100 adjacent to the first gate structures 108.

A selection transistor may be formed on the substrate 100 by the above processes. In an example embodiment of the present invention, a plurality of the selection transistors is formed. Each of the first and second impurity regions 112 and 114 may serve as a common source region or a common drain region of adjacent selection transistors. In an example embodiment of the present invention, the first impurity region 112 serves as a source region of the selection transistors and the second impurity region 114 serves as a drain region of the selection transistors.

Figure 11:
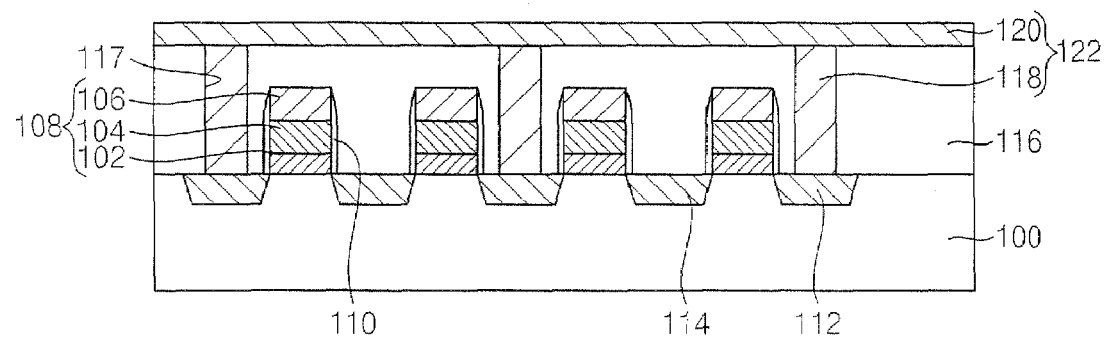

Referring to FIG. 11, a first insulating layer 116 is formed on the substrate 100 to cover the first gate structures 108. The first insulating interlayer 116 may be formed using an oxide such as boro-phosphor silicate glass (BPSG), phosphor silicate glass (PSG), spin-on-glass (SOG), tetraethylorthosilicate (TEOS), plasma-enhanced tetraethylorthosilicate (PE-TEOS), undoped silicate glass (USG), high-density plasma chemical vapor deposition (HDP-CVD) oxide, etc. The first insulating interlayer 116 may be formed by a CVD process, a plasma-enhanced chemical vapor deposition (PECVD) process, a high-density plasma chemical vapor deposition (HDP-CVD) process or an atomic layer deposition (ALD) process.

A planarization process may be further performed on the first insulating interlayer 116. In an example embodiment of the present invention, when performing the planarization process, the first insulating interlayer 116 may be partially removed by a CMP process and an additional insulation layer may be formed on the first insulating interlayer 116.

A second photoresist pattern (not shown) is formed on the first insulating interlayer 116. The second photoresist pattern may serve as an etching mask for forming a first opening 117, which partially exposes a first portion of the substrate 100.

The first insulating interlayer 116 is partially removed by an etching process using the second photoresist pattern as an etching mask to form the first opening 117 through the first insulating interlayer 116. In an example embodiment of the invention, a plurality of the first openings 117 is formed through the first insulating interlayer 116. The second photoresist pattern may be removed by an ashing process and/or a stripping process.

A second conductive layer is formed on the substrate 100 to fill up the first opening 117. The second conductive layer may be formed using doped polysilicon, metal, etc.

The second conductive layer is polished until a top surface of the first insulating interlayer 116 is exposed to form a bit line pad 118 filling up the first opening 117. In an example embodiment of the present invention, a plurality of the bit line pads 118 is formed in the plurality of the first openings 117. The second conductive layer may be polished by an etch-back process, a CMP process, or a combination process of etch-back and CMP.

A third conductive layer is formed on the first insulating interlayer 116 and the bit line pad 118. The third conductive layer may be patterned to form a bit line 120. The bit line 120 is electrically connected to the bit line pad 118. In an example embodiment of the present invention, a plurality of the bit lines 120 is formed to be electrically connected to the plurality of the bit line pads 118.

Particularly, a barrier layer (not shown) and a tungsten layer (not shown) are sequentially deposited on the first insulating interlayer 116 and the bit line pads 118 to form the third conductive layer. The barrier layer may be formed using titanium and titanium nitride. Additionally, a second hard mask layer (not shown) is formed on the third conductive layer. After a third photoresist pattern (not shown) is formed on the second hard mask layer, the second hard mask layer is patterned by an etching process using the third photoresist pattern as an etching mask to form a second hard mask (not shown). In an example embodiment of the present invention, the second hard mask may be formed to have a linear shape extending in the first direction. The third conductive layer is patterned by an etching process using the second hard mask to form the bit lines 120. The second hard mask may be removed afterwards.

Thus, a bit line structure 122 including the bit line pad 118 and the bit line 120 is completed by the above processes. In an example embodiment of the present invention, a plurality of the bit line structures 122 each of which includes the bit line pad 118 and the bit line 120 is formed.

Alternatively, the second conductive layer may be formed to fill up the first opening 117 and have a sufficiently greater height above the first insulating interlayer 116 to form the bit line 120. The second conductive layer may be patterned by an etching process using the second hard mask to form the bit line structure 122 including the bit line pad 118 and the bit line 120 that are electrically connected to each other. In other words, the bit line pad 118 and the bit line 120 may be formed substantially simultaneously.

Figure 12:
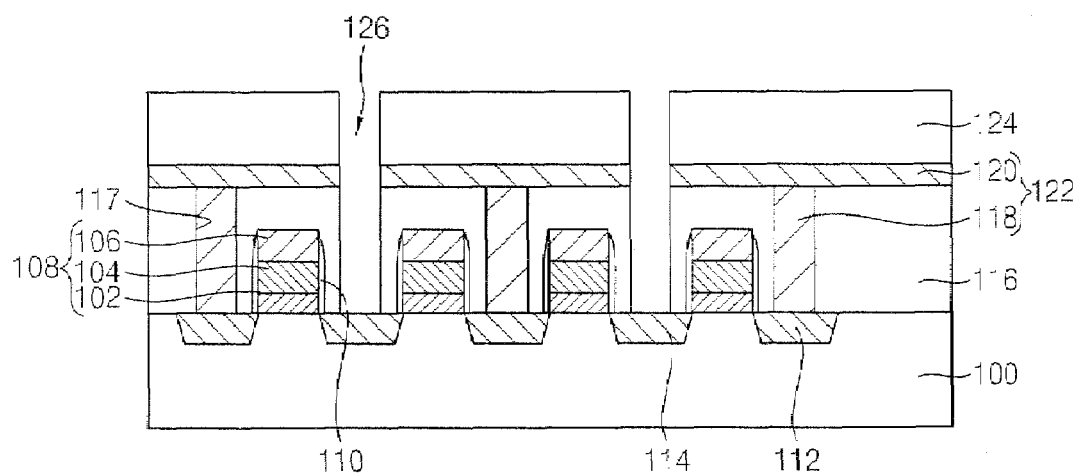

Referring to FIG. 12, a second insulating interlayer 124 is formed on the first insulating interlayer 116 to cover the bit line structure 122. The second insulating interlayer 124 may be formed using an oxide such as BPSG, PSG, SOG, TEOS, PE-TEOS, USG, HDP-CVD oxide, etc. The second insulating interlayer 124 may be formed by a CVD process, a PECVD process, a HDPCVD process or ALD process.

A planarization process may be further performed on the second insulating interlayer 124. Particularly, the second insulating interlayer 124 may be polished by a CMP process. Additionally, an insulation layer may be further formed on the second insulating interlayer 124.

After a fourth photoresist pattern (not shown) is formed on the second insulating interlayer 124, the second insulating interlayer 124 and first insulating interlayer 116 are partially removed by an etching process using the fourth photoresist pattern as an etching mask to form a second opening 126 partially exposing the second impurity region 114 through the first and second insulating interlayers 116 and 124. In an example embodiment of the present invention, a plurality of the second openings 126 is formed through the first and second insulating interlayers 116 and 124.

The fourth photoresist pattern may be removed by an ashing process and/or a stripping process.

Figure 13:
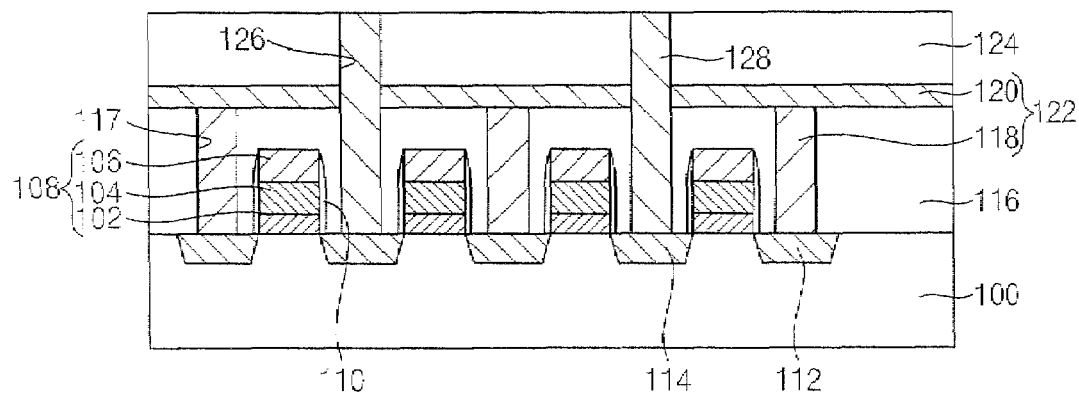

Referring to FIG. 13, a plug 128 is formed on the substrate 100 to fill up the second opening 126. In an example embodiment of the present invention, a plurality of the plugs 128 is formed in the plurality of the second openings 126. In an example embodiment of the present invention, the plug 128 may be formed using single crystalline silicon. Single crystalline silicon may grow by an SEG process using the exposed second impurity region 114 as a seed to fill up the second opening 126. When single crystalline silicon grows, impurities having a high concentration may be doped into the single crystalline silicon in-situ. The impurities may have substantially the same type as those doped in the first and second impurity regions 112 and 114. Single crystalline silicon may sufficiently grow to cover a top surface of the second insulating interlayer 124.

Hereinafter, a process for growing single crystalline silicon is described in detail.

After performing a cleaning process for removing a native oxide layer from the exposed second impurity region 114, an SEG process is performed.

When a process temperature is less than about 750° C., single crystalline silicon may not easily grow. When the process temperature is more than about 1,250° C., controlling growth of single crystalline silicon may not be easy. Thus, the SEG process is preferably performed at a temperature of about 750 to about 1,250° C., and more preferably performed at a temperature of about 800 to about 900° C.

A silicon source gas may serve as a reaction gas used in the SEG process. Examples of the silicon source gas may include tetrachlorosilane gas ($SiCl_4$), silane gas ($SiH_4$), dichlorosilane gas ($SiH_2Cl_2$), trichlorosilane gas ($SiHCl_3$), etc. These may be used alone or in a combination thereof. In an example embodiment of the present invention, tetrachlorosilane gas serves as the silicon source gas.

Single crystalline silicon grows by the above SEG process using the silicon source gas to sufficiently fill up the second opening 126, and single crystalline silicon may grow on a top surface of the second insulating interlayer 124 adjacent to the second opening 126.

In an example embodiment of the present invention, a capping layer (not shown) is formed on the second insulating interlayer 124. The capping layer and a top portion of the plug 128, which is formed on the top surface of the second insulating interlayer 124, are polished by a CMP process.

Thus, the plug 128 filling up the second opening 126 and having a height substantially the same as that of the second insulating interlayer 124 may be formed. Alternatively, the capping layer may not be formed in order to simplify the process.

The second impurity region 114 electrically connected to the plug 128 may serve as a drain region of two adjacent selection transistors. Thus, one plug 128 may serve as a common plug transferring signals of the two adjacent selection transistors.

Figure 14:
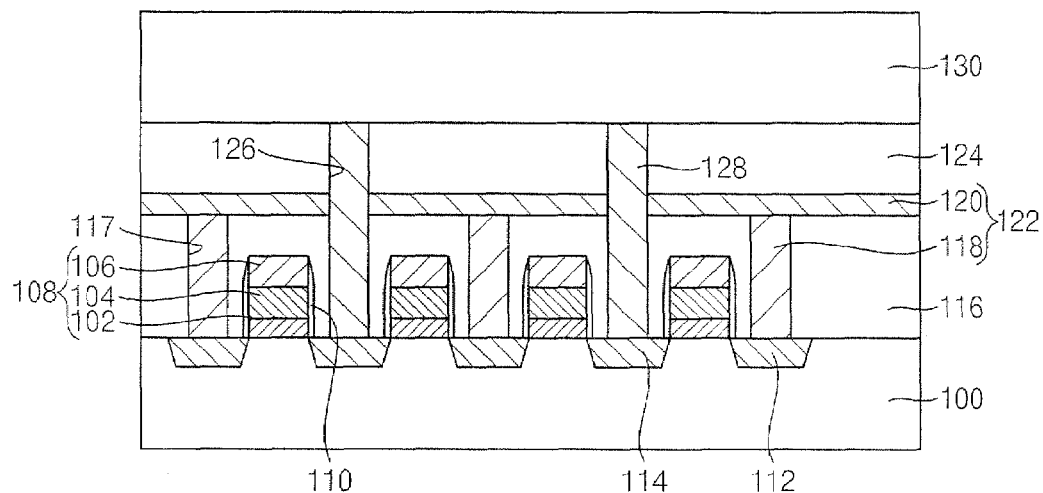

Referring to FIG. 14, a preliminary active layer is formed on the second insulating interlayer 124 and the plug 128. In an example embodiment of the present invention, the preliminary active layer is formed using amorphous silicon.

In an example embodiment of the present invention, an active layer may be formed from the preliminary active layer by transforming amorphous silicon into single crystalline silicon. The plug 128 including single crystalline silicon may be used as a seed in the above process.

Single crystalline silicon may be formed from amorphous silicon by a heat treatment process. When a temperature is less than about 570° C., transforming amorphous silicon into single crystalline silicon may not be easy. When the temperature is more than about 650° C., controlling the heat treatment process may not be easy. Thus, the heat treatment process is preferably performed at a temperature of about 570 to about 650° C., and more preferably performed at a temperature of about 600 to about 620° C.

Alternatively, single crystalline silicon may be formed from amorphous silicon by exposing the preliminary active layer to laser energy.

After forming a fifth photoresist pattern (not shown) on the active layer, the active layer is patterned by an etching process using the fifth photoresist pattern as an etching mask to form an active pattern 130 on the second insulating interlayer 124 and the plug 128. In an example embodiment of the present invention, a plurality of the active patterns 130 is formed on the second insulating interlayer 124 and the plug 128.

The active pattern 130 may serve as an upper active region for forming a ferroelectric transistor. In an example embodiment of the present invention, the active pattern 130 has a linear shape extending in the first direction in which the active region formed at an upper portion of the substrate 100 extends. Additionally, the active pattern 130 may be formed to be opposite to the active region at the upper portion of the substrate 100.

After forming an insulation layer (not shown) on the second insulating interlayer 124 to sufficiently cover the active pattern 130, the insulation layer is polished until a top surface of the active pattern 130 is exposed. That is, when a plurality of the active patterns 130 is formed, the insulation layer may serve as an isolation layer between the active patterns 130.

As illustrated with reference to FIGS. 13 and 14, in one example embodiment of the present invention, the preliminary active layer including amorphous silicon is transformed into the active layer including single crystalline silicon using the plug 128 as a seed. The active layer is patterned to form the active pattern 130 serving as the upper active region.

In another example embodiment of the present invention, the plug 128 and the active pattern 130 including single crystalline silicon may be formed by a damascene process. Particularly, after forming the second insulating interlayer 124 to have a relatively large height, the second insulating interlayer 124 is partially removed to form a second opening 126 for the plug 128 and a trench (not shown) for the active pattern 130. Single crystalline silicon is grown by an SEG process using the substrate 100 as a seed to form a single crystalline silicon layer. The single crystalline silicon layer may sufficiently fill up the second opening 126 and the trench. The single crystalline silicon layer may be polished until a top surface of the second insulating interlayer 124 is exposed. Thus, the plug 128 may be formed in the second opening 126, and the active pattern 130 may be formed in the trench.

Figure 15:
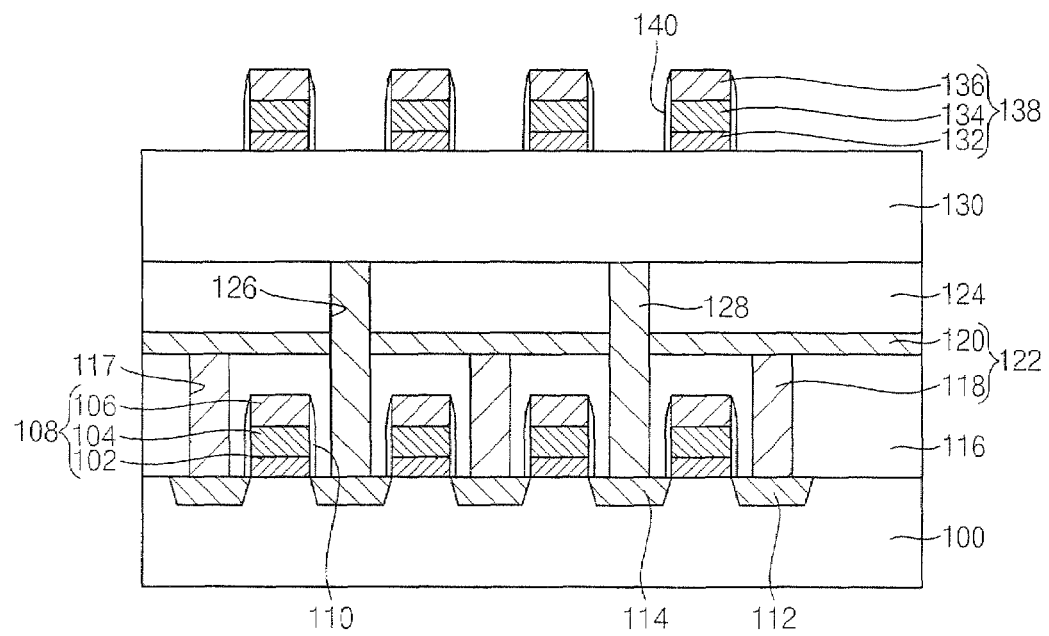

Referring to FIG. 15, a ferroelectric layer is formed on the active pattern 130 and the insulation layer.

The ferroelectric layer may be formed using a material in which polarization may occur according to an external voltage. For example, the ferroelectric layer pattern 132 may be formed using PZT, SBT, BLT, PLZT, BST, etc. When the ferroelectric layer includes PZT, zirconium and titanium may be included at a ratio by weight of about 25:75 to about 40:60. Additionally, the ferroelectric layer may be formed using PZT, SBT, BLT, PLZT, BST, etc., doped with potassium, lanthanum, manganese, bismuth, etc. The ferroelectric layer may be formed by an organo-metal chemical vapor deposition (OMCVD) process, a sol-gel process, an ALD process, etc.

A fourth conductive layer is formed on the ferroelectric layer. The fourth conductive layer may be formed using a doped metal oxide and a metal. In an example embodiment of the present invention, the fourth conductive layer is formed to have a multi-layered structure in which a first layer including strontium ruthenium oxide (SRO), strontium titanium oxide (STO), calcium ruthenium oxide (CRO), etc., each of which is doped with a metal such as copper, lead, bismuth, etc. at about 2 to about 5 percent by weight based on the total weight thereof, and a second layer including a metal such as iridium, platinum, ruthenium, palladium, gold, etc., are sequentially stacked on the ferroelectric layer.

A third hard mask layer is formed on the fourth conductive layer. The third hard mask layer is partially removed by a conventional photolithography process to form a third hard mask 136. The third hard mask 136 may be formed to have a linear shape extending in the second direction substantially perpendicular to the first direction. In an example embodiment of the present invention, the third hard mask layer 136 may be formed to be opposite to the first gate structure 108.

The fourth conductive layer and the ferroelectric layer are partially removed by an etching process using the third hard mask 136 as an etching mask to form a second gate electrode 134 and a ferroelectric layer pattern 132, respectively. Thus, a second gate structure 138 including the ferroelectric layer pattern 132, the second gate electrode 134 and the second hard mask 136 that are sequentially stacked on the active pattern 130 is formed. The second gate structure 138 may have a linear shape extending in the second direction. Thus, the second gate electrode 134 included in the second gate structure 138 may serve not only as a gate electrode of the ferroelectric transistor but also as a gate electrode line. In an example embodiment of the present invention, a plurality of the second gate structures 138 is formed on the active pattern 130.

Additionally, a metal layer or an insulation layer and a metal layer may be further formed on the active pattern 130 prior to forming the ferroelectric layer.

A second spacer layer is formed on the active pattern 130 to cover the second gate structure 138. The second spacer layer may be formed using silicon nitride. The second spacer layer is partially removed by an anisotropic etching process to form a second spacer 140 on a sidewall of the second gate structure 138.

Alternatively, an encapsulating barrier layer (EBL) may be further formed on the second spacer layer to reduce degradation of the ferroelectric layer. The EBL may be formed using aluminum oxide. The second spacer 140 may be formed by partially removing the EBL and the ferroelectric layer.

Figure 16:
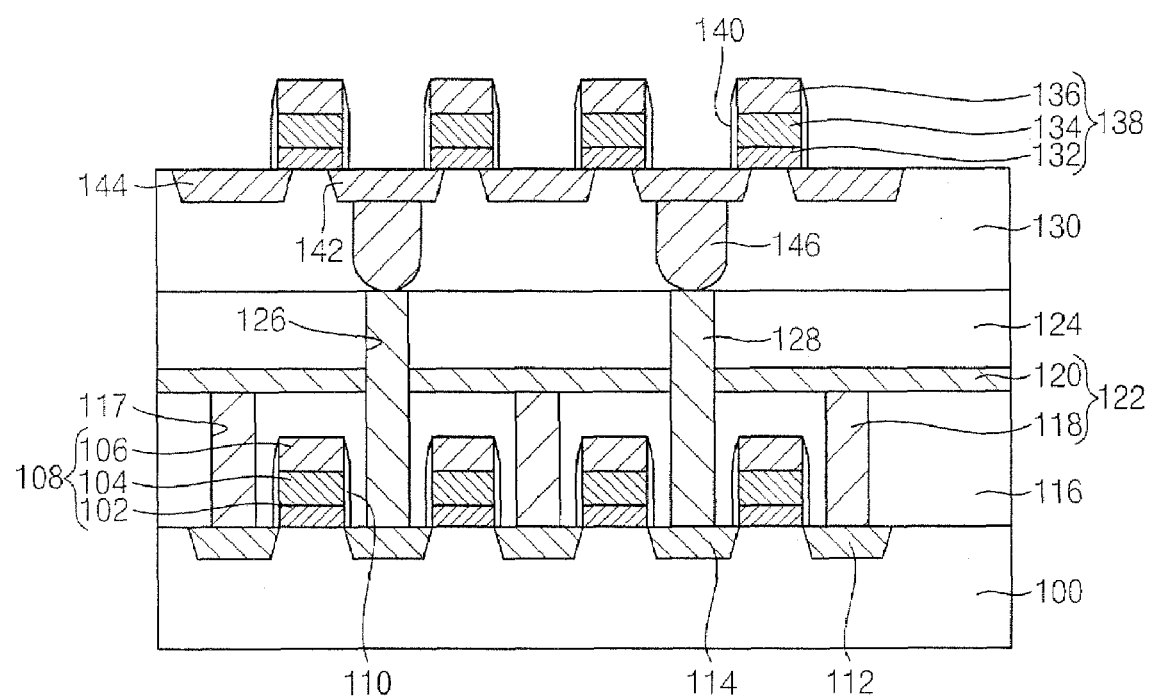

Referring to FIG. 16, impurities are implanted into the active pattern 130 using the second gate structure 138 as an implantation mask. A heat treatment process may be performed on the active pattern 130 to form a third impurity region 142 and a fourth impurity region 144 at a top surface of the active pattern 130 adjacent to the second gate structure 138. In an example embodiment of the invention, the impurities doped into the active pattern 130 may have substantially the same type as those doped into the first and second impurity regions 112 and 114.

The ferroelectric transistor may be formed by the above processes. In an example embodiment of the present invention, a plurality of the ferroelectric transistors is formed to be connected to one another in series. Each of the third and fourth impurity regions 142 and 144 may serve as a source region or a drain region. In an example embodiment of the present invention, the third impurity region 142 may serve as the source region of the ferroelectric transistor, and the fourth impurity region 144 may serve as the drain region of the ferroelectric transistor.

A sixth photoresist pattern (not shown) is formed on the active pattern 130. The sixth photoresist pattern partially exposes a portion of the active pattern 130. Impurities are implanted into the exposed portion of the active pattern 130 using the sixth photoresist pattern as an implantation mask. A heat treatment process is performed on the active pattern 130 to form a fifth impurity region 146, which may electrically connect the third impurity region 142 to the plug 128. When the impurities are implanted into the portion of the active pattern 130, the impurities are deeply implanted thereto, so that the fifth impurity region 146 may make contact with both of the third impurity region 142 and the plug 128. In an example embodiment of the present invention, the impurities doped into the fifth impurity region 146 may have substantially the same type as those doped into the third impurity region 142.

Thus, the drain region of the selection transistor may be electrically connected to the source region of the ferroelectric transistor through the plug 128 and the fifth impurity region 146.

Above, a process for forming the fifth impurity region 146 after forming the third and fourth impurity regions 142 and 144 has been illustrated, however, the fifth impurity region 146 may also be formed prior to forming the third and fourth impurity regions 142 and 144.

Figure 17:
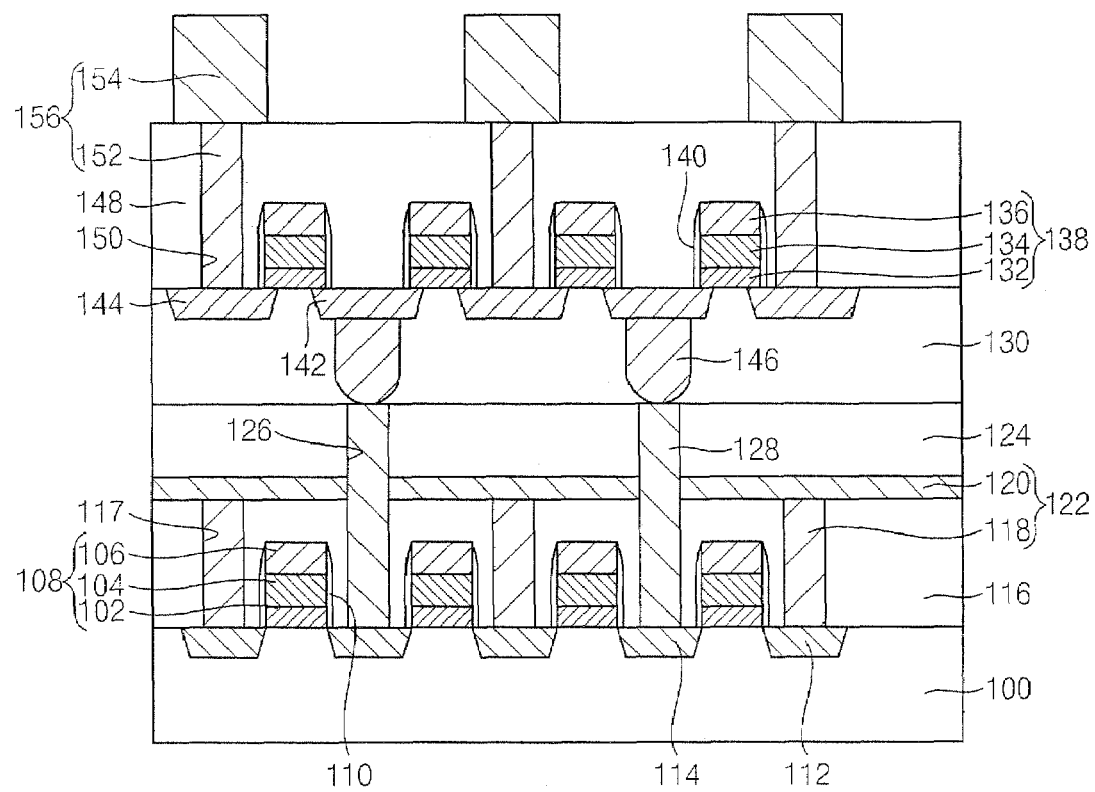

Referring to FIG. 17, a third insulating interlayer 148 is formed on the active pattern 130 to cover the ferroelectric transistor. The third insulating interlayer 148 may be formed using an oxide such as BPSG, PSG, SOG, PE-TEOS, USG, HDP-CVD oxide, etc. The third insulating interlayer 148 may be formed by a CVD process, a PECVD process, an ALD process, etc.

The third insulating interlayer 148 is partially removed by a photolithography process to form a third opening 150 through the third insulating interlayer 148. The third opening 150 may partially expose the fourth impurity region 144. In an example embodiment of the present invention, a plurality of the third openings 150 is formed through the third insulating interlayer 148.

A fifth conductive layer is formed on the third insulating interlayer 148 to fill up the third opening 150. The fifth conductive layer is polished until a top surface of the third insulating interlayer 148 is exposed to form a first data line pad 152 filling up the third opening 150. The fifth conductive layer may be polished by an etch-back process, a CMP process, or a combination process of etch-back and CMP. In an example embodiment of the present invention, a plurality of the first data line pads 152 is formed in a plurality of the third openings 150.

A sixth conductive layer is formed on the third insulating interlayer 148 and the first data line pad 152. The sixth conductive layer is patterned to form a first data line 154 electrically connected to the first data line pad 152. The first data line 154 may be formed to have a linear shape extending in the second direction in which the second gate structure 138 extends. In an example embodiment of the present invention, a plurality of the first data lines 154 is formed on the third insulating interlayer 148 and a plurality of the first data line pads 152.

In an example embodiment of the present invention, a fourth hard mask (not shown) may be further formed on the first data line 154.

A first data line structure 156 including the first data line pad 152 and the first data line 154 may be formed by the above processes.

In an example embodiment of the present invention, the fifth conductive layer may be formed to fill up the third opening 150 and have a sufficiently great height from the third insulating interlayer 148. After planarizing a top surface of the fifth conductive layer, the fifth conductive layer may be patterned by an etching process to simultaneously form the first data line pad 152 and the first data line 154 that are electrically connected to each other.

Figure 18:
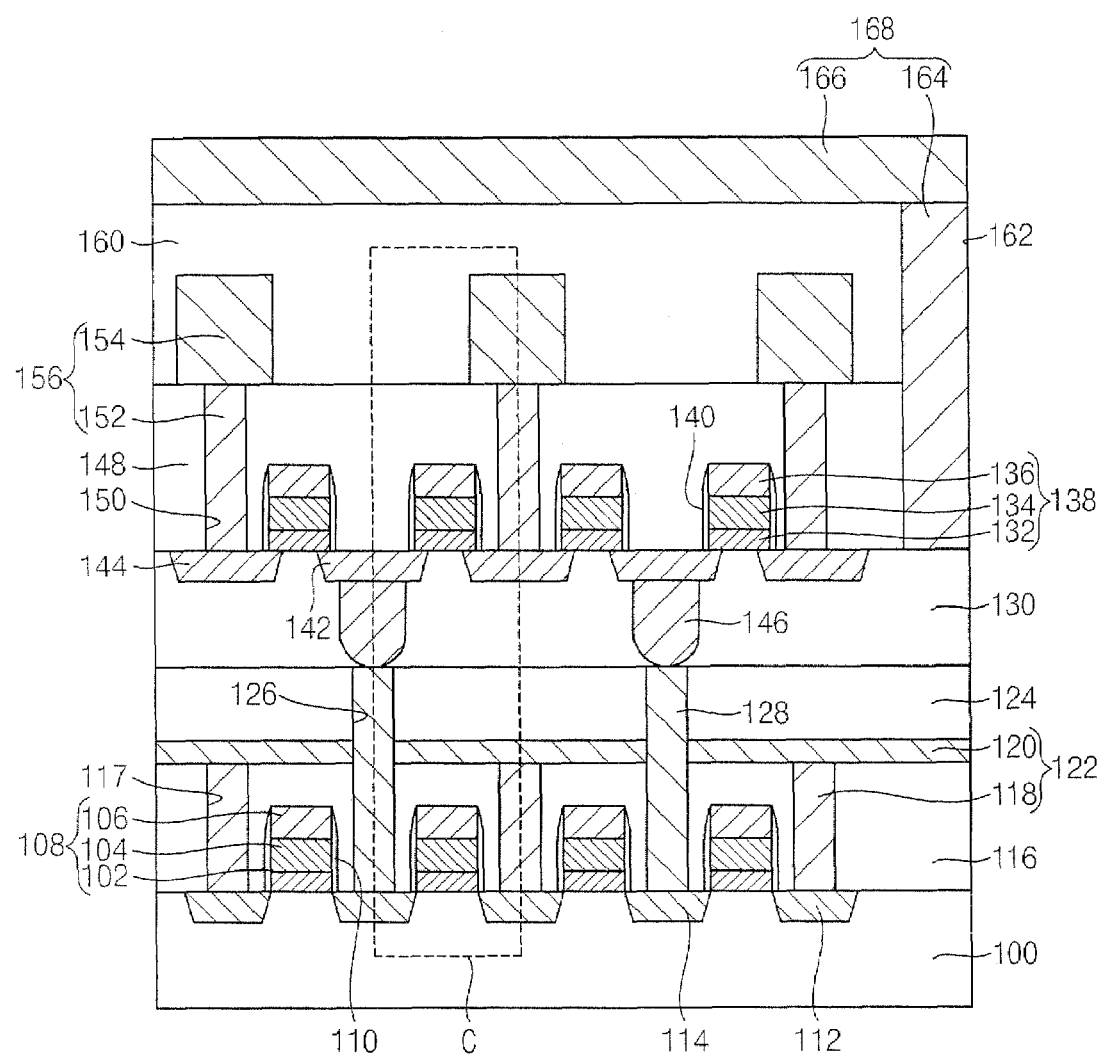

Referring to FIG. 18, a fourth insulating interlayer 160 is formed on the third insulating interlayer 148 to cover the first data line 154. The fourth insulating interlayer 160 and the third insulating interlayer 148 are partially removed by a photolithography process to form a fourth opening 162 through the third and fourth insulating interlayers 148 and 160. The fourth opening 162 may partially expose the active pattern 130. In an example embodiment of the present invention, two fourth openings 162 are formed to expose end portions of the active patterns 130.

A seventh conductive layer is formed on the active pattern 130 to fill up the fourth opening 162. The seventh conductive layer is planarized until a top surface of the fourth insulating interlayer 160 is exposed to form a second data line pad 164 in the fourth opening 162. The seventh conductive layer may be planarized by an etch-back process, a CMP process, or a combination process of etch-back and CMP. In an example embodiment of the present invention, two second data line pads 164 are formed to fill up the two fourth openings 162 exposing the end portions of the active patterns 130.

An eighth conductive layer is formed on the fourth insulating interlayer 160 and the second data line pad 164. The eighth conductive layer is patterned to form a second data line 166 electrically connected to the second data line pad 164. The second data line 166 may be formed to have a linear shape extending in the second direction in which the second gate structure 138 extends. In an example embodiment of the present invention, a plurality of the second data lines 166 is formed on the fourth insulating interlayer 160 and the second data line pad 164. Additionally, a fifth hard mask (not shown) may be further formed on the second data line 154. A second data line structure 168 including the second data line pad 164 and the second data line 166 may be formed by the above processes.

Alternatively, the seventh conductive layer may be formed to fill up the fourth opening 162 and have a sufficiently greater height above the fourth insulating interlayer 160 to allow formation of the second data line 166. After planarizing a top surface of the seventh conductive layer, the seventh conductive layer may be patterned by an etching process to simultaneously form the second data line pad 164 and the second data line 166 that are electrically connected to each other.

A ferroelectric memory device including a selection transistor and a ferroelectric transistor that are vertically stacked in a unit cell may be formed by the above processes. The ferroelectric transistor is formed on an active pattern, which is formed over a substrate, so that a horizontal area for the unit cell may be reduced.

According to some example embodiments of the invention, a ferroelectric memory device may be manufactured having advantages such that data reading time is short without destroying data, and a random access operation, which means data is selectively read or written at a desired address, is possible. Additionally, a unit cell of the ferroelectric memory device may have a size as small as $4F^2$ so that the ferroelectric memory device may have a high degree of integration.

According to one aspect of the invention, there is provided a stacked ferroelectric memory device. The stacked ferroelectric memory device includes a plurality of selection transistors, a first insulating interlayer, a plurality of bit line structures, a second insulating interlayer, a plurality of plugs, a plurality of active patterns, and a plurality of ferroelectric transistors. The plurality of selection transistors is formed on a substrate. The selection transistors are connected in series and each of the selection transistors includes a first gate structure, a first impurity region and a second impurity region. Each of the first and the second impurity regions serves as a common source/drain region of adjacent selection transistors. The first insulating interlayer covers the selection transistors. The plurality of bit line structures is electrically connected to the first impurity regions. The second insulating interlayer covers the bit line structures. The plurality of plugs includes doped single crystalline silicon and is formed through the first and the second insulating interlayers. Each of the plugs makes contact with the second impurity region and has a height greater than those of the bit line structures. The plurality of active patterns is formed on the plugs and the second insulating interlayer. Each of the active patterns makes contact with the plugs. The plurality of ferroelectric transistors is formed on the active patterns. The ferroelectric transistors are connected in series and each of the ferroelectric transistors has a second gate structure, a third impurity region and a fourth impurity region. The second gate structure includes a ferroelectric layer pattern and a conductive pattern that are sequentially stacked. Each of the third and the fourth impurity regions serves as a common source/drain region of adjacent ferroelectric transistors.

In an example embodiment of the invention, the second gate structure may have one of a metal-ferroelectric-silicon (MFS) structure, a metal-ferroelectric-metal-silicon (MFMS) structure and a metal-ferroelectric-metal-insulator-semiconductor (MFMIS) structure.

In an example embodiment of the invention, the third and the fourth impurity regions may be overlapped by side portions of the second gate structure so that at least two polarization states may be stored therein by the second gate structure.

In an example embodiment of the invention, a spacer layer including silicon nitride and an encapsulating barrier layer (EBL) including aluminum oxide may be stacked on a sidewall of the second gate structure to reduce degradation of the ferroelectric layer pattern.

In an example embodiment of the invention, a fifth impurity region may be formed in each of the active patterns to connect the third impurity region to each of the plugs.

In an example embodiment of the invention, the stacked ferroelectric memory device may further include a plurality of first data line structures. Each of the first data line structures may be connected to the fourth impurity region.

In an example embodiment of the invention, the stacked ferroelectric memory device may further include a second data line structure electrically connected to a channel region of each of the ferroelectric transistors. The channel region may be disposed between the third and the fourth impurity regions.

In an example embodiment of the invention, the substrate may include an active region and an isolation region. The active region may have a linear shape extending in a first direction.

In an example embodiment of the invention, the first gate structure may have a linear shape extending in a second direction substantially perpendicular to the first direction.

In an example embodiment of the invention, each of the active patterns may have a linear shape extending in the first direction and is opposite to the active region.

In an example embodiment of the invention, the second gate structure may have a linear shape extending in the second direction substantially perpendicular to the first direction.

According to another aspect of the invention, there is provided a method of manufacturing a stacked ferroelectric memory device. In the method of manufacturing the stacked ferroelectric memory device, a plurality of selection transistors is formed on a substrate. The selection transistors are connected in series and each of the selection transistors includes a first gate structure, a first impurity region and a second impurity region. The first and the second impurity regions are formed at upper portions of the substrate adjacent to the first gate structure. A first insulating interlayer is formed on the substrate to cover the selection transistors. A plurality of bit line structures electrically connected to the first impurity regions is formed. A second insulating interlayer is formed on the first insulating interlayer to cover the bit line structures. A plurality of plugs is formed using doped single crystalline silicon through the first and the second insulating interlayers. Each of the plugs makes contact with the second impurity region and has a height greater than those of the bit line structures. A plurality of active patterns is formed on the plugs and the second insulating interlayer. Each of the active patterns makes contact with the plugs. A plurality of ferroelectric transistors is formed on the active patterns. The ferroelectric transistors are connected in series and each of the ferroelectric transistors has a second gate structure, a third impurity region and a fourth impurity region. The second gate structure includes a ferroelectric layer pattern and a conductive pattern that are sequentially stacked.

In an example embodiment of the invention, the second gate structure may be formed to have one of an MFS structure, an MFMS structure and an MFMIS structure.

In an example embodiment of the invention, the third and the fourth impurity regions may be formed to be overlapped by side portions of the second gate structure by an implantation process, so that at least two polarization states may be stored therein by the second gate structure.

In an example embodiment of the invention, a spacer layer may be further formed using silicon nitride on the active patterns to cover the second gate structures. An EBL may be further formed on sidewalls of the second gate structures using aluminum oxide to reduce degradation of the ferroelectric layer pattern. A plurality of spacers may be further formed on the sidewalls of the second gate structures by anisotropically etching the spacer layer and the EBL.

In an example embodiment of the invention, a trench extending in a first direction may be further formed on the substrate by partially etching the substrate. An active region and an isolation region of the substrate may be further formed by filling the trench with an insulating material.

In an example embodiment of the invention, the first gate structure may be formed to extend in a second direction substantially perpendicular to the first direction. Impurities may be implanted onto portions of the substrate, which is not covered by the first gate structure, to form a first impurity region and a second impurity region, which are partially overlapped by side portions of the first gate structure.

In an example embodiment of the invention, a fifth impurity region may be further formed in each of the active patterns by an implantation process to connect the third impurity region to each of the plugs.

In an example embodiment of the invention, a third insulating interlayer may be further formed on the active patterns to cover the ferroelectric transistors after forming the ferroelectric transistors. A plurality of first data line structures, each of which includes a first data line pad and a first data line, may be further formed. The first data line pad may be formed through the third insulating interlayer to make contact with the fourth impurity region, and the first data line may be electrically connected to the first data line pad.

In an example embodiment of the invention, a fourth insulating interlayer may be further formed on the fourth insulating interlayer. A plurality of second data line structures, each of which includes a second data line pad and a second data line, may be further formed.

The second data line pad may be formed through the third and the fourth insulating interlayers to make contact with a channel region of each of the active pattern. The second data line may be electrically connected to the second data line pad. The channel region may be disposed between the third and fourth impurity regions.

In an example embodiment of the invention, when the active patterns are formed, a preliminary active layer may be formed on the plugs and the second insulating interlayer using amorphous silicon. An active layer may be formed from the preliminary active layer by transforming amorphous silicon into single crystalline silicon. The active patterns may be formed by patterning the active layer and have a linear shape extending in the first direction.

In an example embodiment of the invention, the second gate structure may have a linear shape extending in the second direction.

The above stacked ferroelectric memory device has a stacked structure in which selection transistors and ferroelectric transistors are vertically stacked in a unit cell so that the stacked ferroelectric transistor device may have a high integration degree. Additionally, a random access operation is possible and data is quickly readable without destroying data, i.e., a non-destructive readout (NDRO) operation is possible, in the stacked ferroelectric memory device.

According to still another aspect of the invention, there is a ferroelectric memory circuit. The ferroelectric memory circuit includes a first string, a plurality of word lines, a plurality of bit lines, a second string, a plurality of plate electrode lines, a plurality of first data lines, and a plurality of second data lines. The first string has a plurality of selection transistors each of which includes a first gate structure, a first source region and a first drain region. The selection transistors are connected in series and the first string extends in a first direction. The plurality of word lines connects the first gate structures disposed in a second direction substantially perpendicular to the first direction. The plurality of bit lines extends in the first direction. The bit lines are connected to the first source regions. The second string has a plurality of ferroelectric transistors, each of which includes a second gate structure, a second source region and a second drain region. The ferroelectric transistors are formed on an active pattern to be connected in series and the second string extends in a third direction. The second source region and the second drain region are overlapped by side portions of the second gate structure so that each of the ferroelectric transistors stores multi-level information, and the second source region is electrically connected to a corresponding first drain region. The plurality of plate electrode lines connects between the second gate structures disposed in a fourth direction substantially perpendicular to the third direction. The plurality of first data lines is electrically connected to the second drain region. The plurality of second data lines is electrically connected to the active pattern.

In a method of driving a semiconductor device including the above ferroelectric memory circuit, in one example embodiment of the invention, a polarization direction may be recorded in each of a first region, a second region and a third region by turning on the selection transistor and applying a predetermined voltage to each of the second gate structure, the second source region and the second drain region. The second source region may be overlapped by the first region of the second gate structure, a channel region disposed between the second source region and the second drain region may be overlapped by the second region, and the second drain region may be overlapped by the third region. Two data may be read from one ferroelectric transistor by turning on the selection transistor and measuring a drain current of the ferroelectric transistor. The drain current may vary according to the polarization direction of each region of the second gate structure.

In an example embodiment of the invention, when the polarization directions in the second and the third regions are recorded to be different from that of the first region, substantially the same polarization directions may be recorded in each of the first, the second and the third regions, and the polarization direction in the first region may be changed while recording the polarization direction.

In an example embodiment of the invention, when the polarization directions in the first and the third regions are recorded to be different from that of the second region, substantially the same polarization directions may be recorded in each of the first, the second and the third regions, and the polarization direction in the first and the third regions may be changed while recording the polarization direction.

In an example embodiment of the invention, when reading the two data, data "1" and "1" may be read when the drain current is determined to be larger than a first reference current. Data "1" and "0" may be read when the drain current is determined to be smaller than the first reference current and larger than a second reference current. Data "0" and "1" may be read when the drain current is determined to be smaller than the second reference current and larger than a third reference current. Data "0" and "0" may be read when the drain current is determined to be smaller than the third reference current.

According to some example embodiments of the invention, the ferroelectric memory device having the above-mentioned cell circuits may have unit cells, each of which is capable of performing reading/writing operations for at least two data. Thus, the ferroelectric memory device may have a high degree of integration.

The foregoing is illustrative of the present invention and is not to be construed as limiting thereof. Although a few example embodiments of the present invention have been described, those skilled in the art will readily appreciate that many modifications are available in the example embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific example embodiments disclosed, and that modifications to the disclosed example embodiments, as well as other example embodiments, are intended to be included within the scope of the appended claims. The present invention is defined by the following claims, with equivalents of the claims to be included therein.

What is claimed is:

1. A stacked ferroelectric memory device comprising:
a plurality of selection transistors on a substrate, wherein each of the selection transistors includes a first gate structure, a first impurity region and a second impurity region;
a first insulating interlayer covering the selection transistors;
a plurality of bit line structures electrically connected to the first impurity regions;

a second insulating interlayer covering the bit line structures;

a plurality of plugs disposed through the first and the second insulating interlayers, wherein each of the plugs makes contact with the second impurity region;

a plurality of active patterns on the plugs and the second insulating interlayer, wherein each of the active patterns makes contact with the plugs; and a plurality of ferroelectric transistors on the active patterns, wherein each of the ferroelectric transistors includes a second gate structure, a third impurity region and a fourth impurity region, and wherein the second gate structure includes a ferroelectric layer pattern and a conductive pattern.

2. The device of claim 1, wherein the plurality of selection transistors are connected in series and the plurality of ferroelectric transistors are connected in series.

3. The device of claim 2, wherein each of the first and the second impurity regions serves as a common source/drain region of adjacent selection transistors and each of the third and the fourth impurity regions serves as a common source/drain region of adjacent ferroelectric transistors.

4. The device of claim 1, wherein each of the plurality of plugs comprises doped single crystalline silicon.

5. The device of claim 1, wherein the ferroelectric layer pattern and the conductive pattern are sequentially stacked in each of the second gate structures.

6. The device of claim 1, wherein each of the plurality of plugs has a height greater than those of the bit line structures.

7. The device of claim 1, wherein each of the second gate structures comprises one of a metal-ferroelectric-silicon (MFS) structure, a metal-ferroelectric-metal-silicon (MFMS) structure and a metal-ferroelectric-metal-insulator-semiconductor (MFMIS) structure.

8. The device of claim 1, wherein the third and the fourth impurity regions are overlapped by side portions of the second gate structure.

9. The device of claim 8, wherein each of the second gate structures is configured to store at least two polarization states.

10. The device of claim 1, wherein a spacer layer and an encapsulating barrier layer (EBL) are stacked on a sidewall of the second gate structure.

11. The device of claim 10, wherein the spacer layer comprises silicon nitride and the EBL comprises aluminum oxide.

12. The device of claim 1, wherein a fifth impurity region is disposed in each of the active patterns to connect the third impurity region to each of the plugs.

13. The device of claim 1, further comprising a plurality of first data line structures, wherein each of the first data line structures is connected to the fourth impurity region.

14. The device of claim 1, further comprising a second data line structure electrically connected to a channel region of each of the ferroelectric transistors, wherein the channel region is disposed between the third and the fourth impurity regions.

15. The device of claim 1, wherein the substrate includes an active region and an isolation region, and wherein the active region has a linear shape extending in a first direction.

16. The device of claim 15, wherein each of the first gate structures has a linear shape extending in a second direction substantially perpendicular to the first direction.

17. The device of claim 15, wherein each of the active patterns has a linear shape extending in the first direction.

18. The device of claim 16, wherein each of the second gate structures has a linear shape extending in the second direction.

19. A ferroelectric memory circuit comprising:

a first string having a plurality of selection transistors each of which includes a first gate structure, a first source region and a first drain region, wherein the selection transistors are connected in series and the first string extends in a first direction;

a plurality of word lines disposed in a second direction substantially perpendicular to the first direction and electrically connected to at least one of the first gate structures;

a plurality of bit lines extending in the first direction, wherein the bit lines are connected to at least one of the first source regions;

a second string having a plurality of ferroelectric transistors each of which includes a second gate structure, a second source region and a second drain region, wherein the ferroelectric transistors are formed on an active pattern to be connected in series and the second string extends in a third direction, wherein the second source region and the second drain region are overlapped by side portions of the second gate structure, and wherein the second source region is electrically connected to a corresponding first drain region;

a plurality of plate electrode lines disposed in a fourth direction substantially perpendicular to the third direction, wherein the plate electrode lines are electrically connected to at least one of the second gate structures;

a plurality of first data lines electrically connected to the second drain region; and a plurality of second data lines electrically connected to the active pattern.

20. A method of driving a ferroelectric memory device, the method comprising:

recording a polarization direction in each of a first region, a second region, and a third region of a second gate structure of a ferroelectric transistor by turning on a selection transistor and applying a predetermined voltage to each of the second gate structure, a second source region and a second drain region of the ferroelectric transistor, wherein the second source region is overlapped by the first region of the second gate structure, a channel region disposed between the second source region and the second drain region is overlapped by the second region, and the second drain region is overlapped by the third region; and reading two data from the ferroelectric transistor by turning on the selection transistor and measuring a drain current of the ferroelectric transistor, wherein the drain current varies according to the polarization direction of each region of the second gate structure.

21. The method of claim 20, wherein recording the polarization direction comprises:

recording substantially the same polarization directions in each of the first, the second and the third regions; and changing the polarization direction in the first and the third regions, so that the polarization directions in the first and the third regions are recorded to be different from that of the second region.

22. The method of claim 20, wherein reading the two data comprises:

reading data "1" and "1" when the drain current is determined to be larger than a first reference current;

reading data "1" and "0" when the drain current is determined to be smaller than the first reference current but larger than a second reference current;

reading data "0" and "1" when the drain current is determined to be smaller than the second reference current but larger than a third reference current; and reading data "0" and "0" when the drain current is determined to be smaller than the third reference current.

23. The method of claim 20, wherein recording the polarization direction comprises:

recording substantially the same polarization directions in each of the first, the second and the third regions; and changing the polarization direction in the first region, so that the polarization direction in the first region is recorded to be different from that of the second and third regions.

* * * * *

UNITED STATES PATENT AND TRADEMARK OFFICE
CERTIFICATE OF CORRECTION

| | |
|---|---|
| PATENT NO. | : 7,586,774 B2 |
| APPLICATION NO. | : 11/675007 |
| DATED | : September 8, 2009 |
| INVENTOR(S) | : Heung-Jin Joo et al. |

Page 1 of 1

It is certified that error appears in the above-identified patent and that said Letters Patent is hereby corrected as shown below:

Column 3, line 49, the word "arc" should read -- are --.

Signed and Sealed this

Eighth Day of December, 2009

David J. Kappos
*Director of the United States Patent and Trademark Office*